(12) United States Patent
Hersam et al.

(10) Patent No.: US 10,944,047 B2
(45) Date of Patent: Mar. 9, 2021

(54) THERMALLY ACTIVATED MEMRISTORS, FABRICATING METHODS AND APPLICATIONS OF SAME

(71) Applicant: NORTHWESTERN UNIVERSITY, Evanston, IL (US)

(72) Inventors: Mark C. Hersam, Wilmette, IL (US); Vinod K. Sangwan, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 16/508,464

(22) Filed: Jul. 11, 2019

(65) Prior Publication Data
US 2020/0083440 A1 Mar. 12, 2020

Related U.S. Application Data

(60) Provisional application No. 62/700,645, filed on Jul. 19, 2018.

(51) Int. Cl.
*H01L 43/08* (2006.01)
*H01L 43/02* (2006.01)
(Continued)

(52) U.S. Cl.
CPC .............. *H01L 43/08* (2013.01); *H01L 43/02* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01L 45/00; H01L 27/112
See application file for complete search history.

(56) References Cited

U.S. PATENT DOCUMENTS

| 9,336,870 B1 | 5/2016 | Mickel et al. |
| 2016/0248007 A1 | 8/2016 | Hersam et al. |
| 2020/0027921 A1* | 1/2020 | Liu .................. B01J 13/02 |

FOREIGN PATENT DOCUMENTS

WO 2005033685 A2 4/2005

OTHER PUBLICATIONS

Crane, H.D. The neuristor. IRE Trans. on Elect. Computers EC-9, 370-371 (1960).

(Continued)

*Primary Examiner* — Hsien Ming Lee
(74) *Attorney, Agent, or Firm* — Locke Lord LLP; Tim Tingkang Xia, Esq.

(57) ABSTRACT

Thermally activated memristors from solution-processed two-dimensional (2D) semiconductors, fabricating methods and applications of the same. The memristor includes a semiconductor film formed on a nanoporous membrane, and at least two electrodes spatial-apart formed on the semiconductor film and electrically coupled with the semiconductor film to define a channel in the semiconductor film between the at least two electrodes, where the channel has one or more filaments, one or more dendrite, or a combination of them formed in the semiconductor film. The underlying switching mechanism applies generally to a range of 2D semiconductors including, but not limited to, $MoS_2$, $MoSe_2$, $WS_2$, $ReS_2$, $InSe$, or related 2D semiconductor materials.

31 Claims, 29 Drawing Sheets
(27 of 29 Drawing Sheet(s) Filed in Color)

(51) Int. Cl.
*H01L 43/10* (2006.01)
*H01L 43/12* (2006.01)

(56) References Cited

OTHER PUBLICATIONS

Kumar, S., Strachan, J.P. & Williams, R.S Chaotic dynamics in nanoscale NbO2 Mott memristors for analogue computing. Nature 548, 318-321 (2017).
Pickett, M.D., Medeiros-Ribeiro, G. & Williams, R.S. A scalable neuristor built with Mott memristors. Nat. Mater. 12, 114-117 (2013).
Kim, S., et al. Experimental demonstration of a second-order memristor and its ability to biorealistically implement synaptic plasticity. Nano Lett. 15, 2203-2211 (2015).
Leon, C. Memristor, Hodgkin—Huxley, and edge of chaos. Nanotechnology 24, 383001 (2013).
Yang, J.J., Strukov, D.B. & Stewart, D.R. Memristive devices for computing. Nat. Nanotechnol. 8, 13-24 (2013).
Bessonov, A.A., et al. Layered memristive and memcapacitive switches for printable electronics. Nat. Mater. 14, 199-204 (2015).
Sangwan, V.K., et al. Gate-tunable memristive phenomena mediated by grain boundaries in single-layer MoS2. Nat. Nanotechnol. 10, 403-406 (2015).
Sangwan, V.K., et al. Multi-terminal memtransistors from polycrystalline monolayer molybdenum disulfide. Nature 554, 500-504 (2018).
Chen, M., et al. Multibit data storage states formed in plasma-treated MoS2 transistors. ACS Nano 8, 4023-4032 (2014).
Son, D., et al. Colloidal synthesis of uniform-sized molybdenum disulfide nanosheets for wafer-scale flexible nonvolatile memory. Adv. Mater. 28, 9326-9332 (2016).
Ge, R., et al. Atomristor: Nonvolatile resistance switching in atomic sheets of transition metal dichalcogenides. Nano Lett 18, 434-441 (2018).
Tan, C., Liu, Z., Huang, W. & Zhang, H. Non-volatile resistive memory devices based on solution-processed ultrathin two-dimensional nanomaterials. Chem. Soc. Rev. 44, 2615-2628 (2015).
Kang, J., Sangwan, V.K., Wood, J.D. & Hersam, M.C. Solution-based processing of monodisperse two-dimensional nanomaterials. Am Chem. Res. 50, 943-951 (2017).
Kang, J., et al. Thickness sorting of two-dimensional transition metal dichalcogenides via copolymer-assisted density gradient ultracentrifugation. Nat. Commun. 5, 5478 (2014).
Title, R.S. & Shafer, M.W. Band structure of the layered transition-metal dichalcogenides: An experimental study by electron paramagnetic resonance on Nb-doped MoS2. Phys. Rev. Lett. 28, 808-810 (1972).
Yu, X., Prévot, M.S. & Sivula, K. Multiflake thin film electronic devices of solution processed 2D MoS2 enabled by sonopolymer assisted exfoliation and surface modification. Chem. Mater. 26, 5892-5899 (2014).
Cunningham, G., et al. Photoconductivity of solution-processed MoS2 films. J. Mater. Chem. C 1, 6899-6904 (2013).
Kelly, A.G., et al. All-printed thin-film transistors from networks of liquid-exfoliated nanosheets. Science 356, 69-73 (2017).
Benoist, L., et al. X-ray photoelectron spectroscopy characterization of amorphous molybdenum oxysulfide thin films. Thin Solid Films 258, 110-114 (1995).
Chua, L. Resistance switching memories are memristors. Appl. Phys. A 102, 765-783 (2011).
Kuchler, A. High Voltage Engineering. Springer Nature, 2018.
Yang, J.J., et al. Memristive switching mechanism for metal/oxide/metal nanodevices. Nat. Nanotechnol. 3, 429-433 (2008).
Mason, J.H. Discharges. IEEE Trans. on Elect. Insulation EI-13, 211-238 (1978).
Chang, S., et al. Occurrence of both unipolar memory and threshold resistance switching in a NiO film. Phys. Rev. Lett. 102, 026801 (2009).
Strukov, D.B., Alibart, F. & Stanley Williams, R. Thermophoresis/diffusion as a plausible mechanism for unipolar resistive switching in metal-oxide-metal memristors. Appl. Phys. A 107, 509-518 (2012).
Oh, H.M., et al. Photochemical reaction in monolayer MoS2 via correlated photoluminescence, Raman spectroscopy, and atomic force microscopy. ACS Nano 10, 5230-5236 (2016).
Niemeyer, L., Pietronero, L. & Wiesmann, H.J. Fractal dimension of dielectric breakdown. Phys. Rev. Lett. 52, 1033-1036 (1984).
Kang, J., et al. Layer-by-layer sorting of rhenium disulfide via high-density isopycnic density gradient ultracentrifugation. Nano Lett. 16, 7216-7223 (2016).
Abdelouahab, M.-S., Lozi, R. & Chua, L. Memfractance: A mathematical paradigm for circuit elements with memory. Inter. J. of Bifur. and Chaos 24, 1430023 (2014).
Kang, J., et al. Solvent exfoliation of electronic-grade, two-dimensional black phosphorus. ACS Nano 9, 3596-3604 (2015).
Kang, J., et al. Stable aqueous dispersions of optically and electronically active phosphorene. Proc. Natl. Acad. Sci. U. S. A. 113, 11688-11693 (2016).
Eda, G., et al. Photoluminescence from chemically exfoliated MoS2. Nano Lett. 11, 5111-5116 (2011).
Kim, I.S., et al. Influence of stoichiometry on the optical and electrical properties of chemical vapor deposition derived MoS2. ACS Nano 8, 10551-10558 (2014).
Baker, M.A., Gilmore, R., Lenardi, C. & Gissler, W. XPS investigation of preferential sputtering of S from MoS2 and determination of MoSx stoichiometry from Mo and S peak positions. Appl. Surf. Sci. 150, 255-262 (1999).
Lee, C., et al. Anomalous lattice vibrations of single- and few-layer MoS2. ACS Nano 4, 2695-2700 (2010).
Cunningham, Graeme et al., "Photoconductivity of solution-processed MoS2 films", Journal of Materials Chemistry C, Issue 41, pp. 1-17, Jan. 1, 2013.
Ascoli, A. et al., "Unfolding the local activity of a memristor", 14th International Workshop on Cellular Nanoscale Networks and their Applications (CNNA), pp. 1-2, 2014.
KIPO (ISA/KR), "International Search Report for PCT/US2019/041296", Republic of Korea, dated Oct. 24, 2019.

* cited by examiner

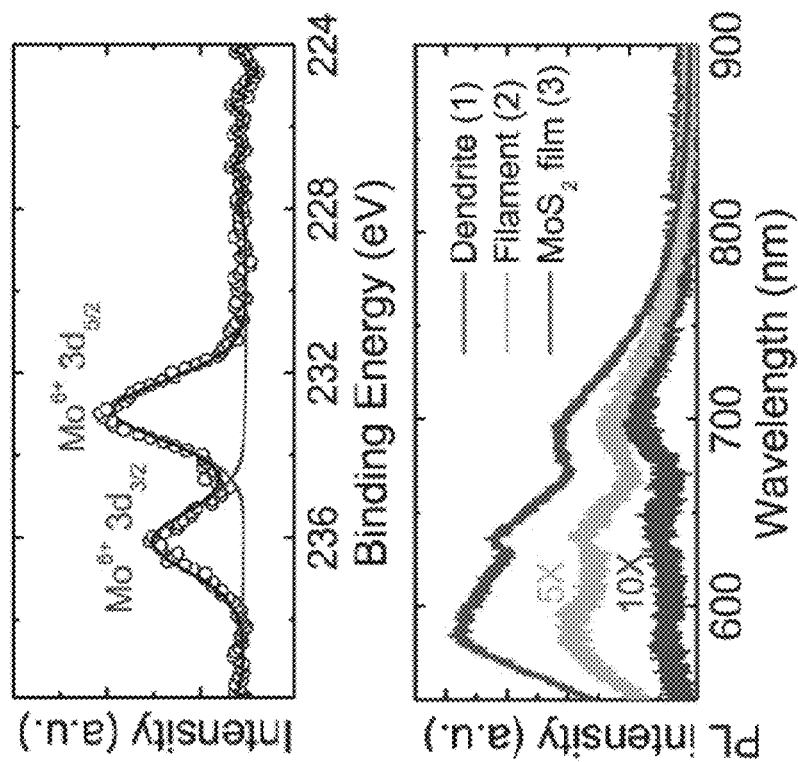
FIG. 3B
FIG. 3C
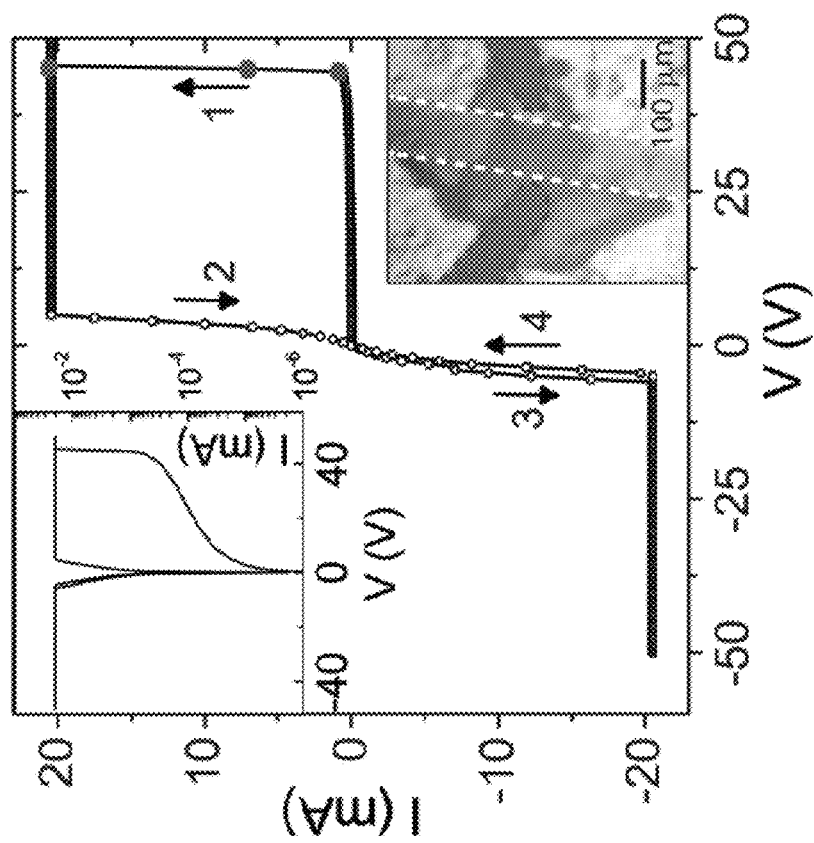
FIG. 3A

500 μm

| Unannealed MoS$_2$: Mo 3d peaks | | | | |
|---|---|---|---|---|
| Peak | Unetched | 3 nm | 6 nm | 27 nm |
| S2s | 226.5 | 226.5 | 226.4 | 226.5 |
| C | | 229.1 | 228.7 | 228.5 |
| C' | | 232 | 231.8 | 231.7 |
| Mo$^{4+}$ 3d5/2 | 229.2 | 229.2 | 229.1 | 229.2 |
| Mo$^{4+}$ 3d3/2 | 232.2 | 232.6 | 232.5 | 232.5 |
| B | 229.4 | | | |
| B' | 232.7 | | | |
| Unannealed MoS$_2$: Sulfur 2p peaks | | | | |
| S 2p3/2 | 162.1 | 162.1 | 162.0 | 162.2 |
| S 2p1/2 | 163.3 | 163.3 | 163.2 | 163.4 |
| F | | 162.3 | 162.2 | 163.3 |
| F' | | 163.6 | 163.4 | 164.4 |
| Annealed MoS$_2$: Mo 3d peaks | | | | |
| S2s | 226.4 | 226.5 | 226.6 | 226.7 |
| C | | 228.8 | 228.7 | 228.7 |
| C' | | 231.9 | 231.9 | 231.8 |
| Mo$^{4+}$ 3d5/2 | 229.2 | 229.2 | 229.2 | 229.1 |
| Mo$^{4+}$ 3d3/2 | 232.3 | 232.6 | 232.6 | 232.4 |
| B | | 230.4 | 230.2 | 229.8 |
| B' | | 233.8 | 233.6 | 233.2 |
| Mo$^{6+}$ 3d5/2 | 232.9 | | | |
| Mo$^{6+}$ 3d3/2 | 235.8 | | | |
| Annealed MoS$_2$: Sulfur 2p peaks | | | | |
| D | 161.8 | | | |
| D' | 163.0 | | | |
| S 2p3/2 | 162.2 | 162.1 | 162.1 | 162.3 |
| S 2p1/2 | 163.3 | 163.3 | 163.3 | 163.5 |
| F | | 162.8 | 163.4 | 163.1 |
| F' | | 163.9 | 164.7 | 164.4 |

FIG. 8

FIG. 12A  optical
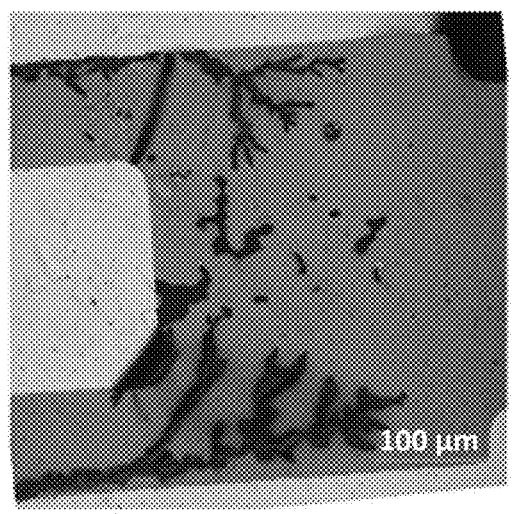
FIG. 12B  Au
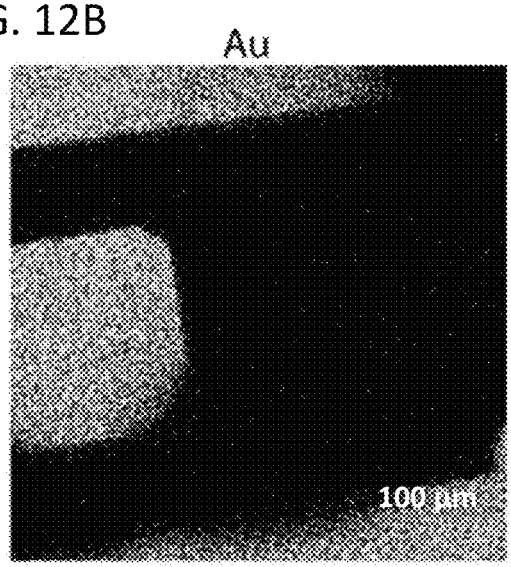
FIG. 12C  S
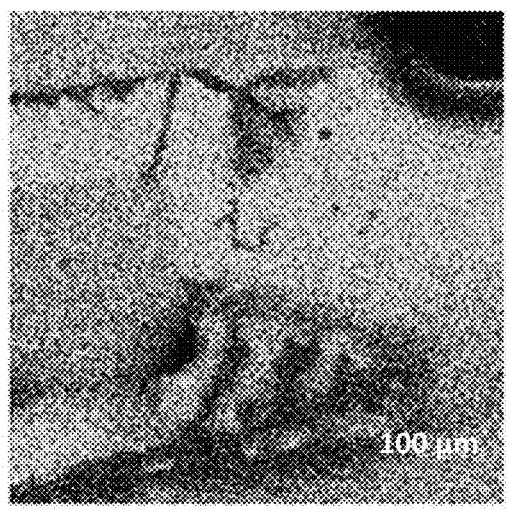
FIG. 12D  Mo
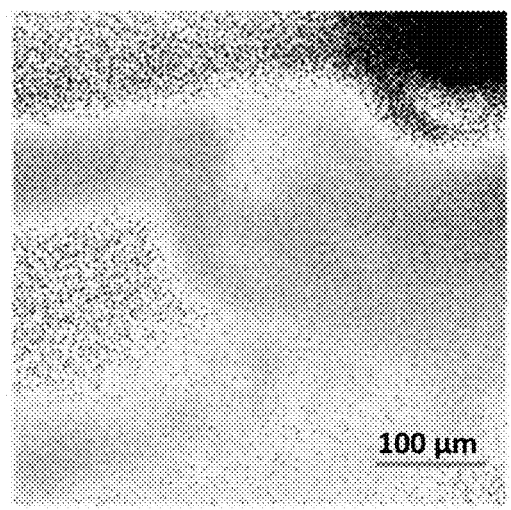
FIG. 12E  optical
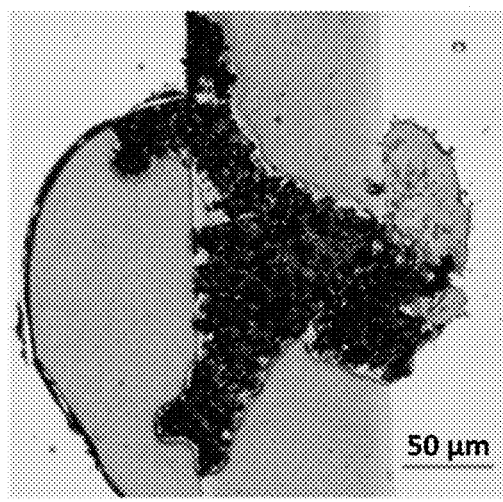
FIG. 12F  Mo
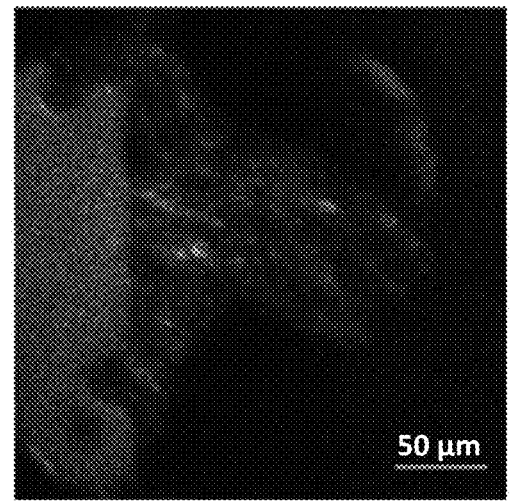

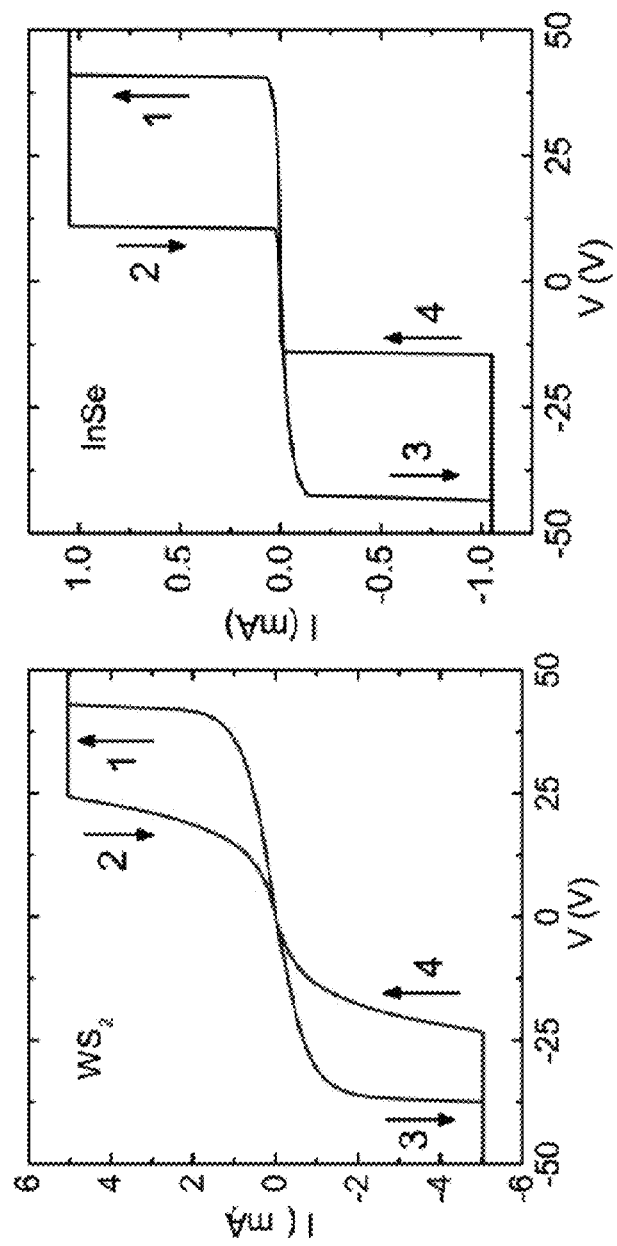
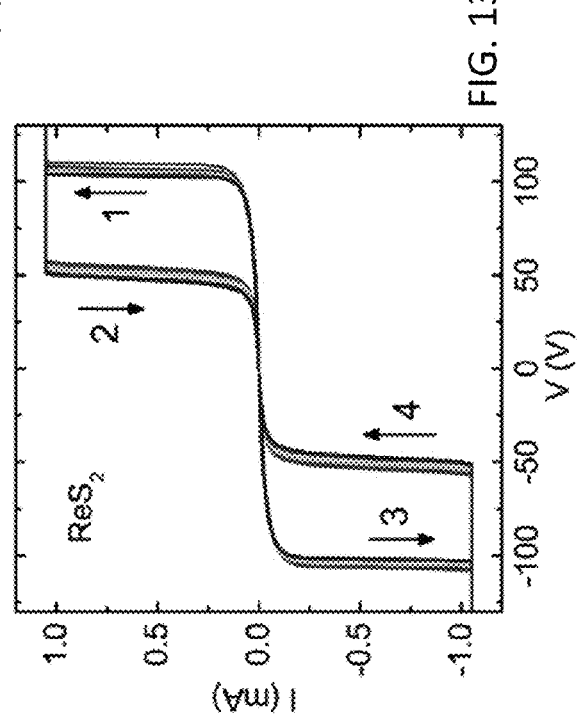
FIG. 13A
FIG. 13B
FIG. 13C

THERMALLY ACTIVATED MEMRISTORS, FABRICATING METHODS AND APPLICATIONS OF SAME

CROSS-REFERENCE TO RELATED PATENT APPLICATION

This application claims priority to and the benefit of, pursuant to 35 U.S.C. § 119(e), U.S. provisional patent application Ser. No. 62/700,645, filed Jul. 19, 2018, entitled "THERMALLY ACTIVATED MEMRISTORS FROM SOLUTION-PROCESSED TWO-DIMENSIONAL SEMICONDUCTORS, FABRICATING METHODS AND APPLICATIONS OF SAME," by Mark C. Hersam and Vinod K. Sangwan, which is incorporated herein in its entirety by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [8] represents the 8th reference cited in the reference list, namely, Sangwan, V. K., et al. Gate-tunable memristive phenomena mediated by grain boundaries in single-layer $MoS_2$. *Nat. Nanotechnol.* 10, 403-406 (2015).

STATEMENT AS TO RIGHTS UNDER FEDERALLY-SPONSORED RESEARCH

This invention was made with government support under DMR-1720139, EFRI-1433510 and DMR-1505849 awarded by the National Science Foundation. The government has certain rights in the invention.

FIELD OF THE INVENTION

The present invention relates generally to semiconductors, and more particularly to thermally activated memristors from solution-processed two-dimensional semiconductors, fabricating methods and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

Neuromorphic (i.e., brainlike) computing holds significant potential for next-generation, low-power information processing. However, to achieve this goal, fundamental advances are required in the underlying electronic devices and computing architectures. For example, associative memory can be realized in novel devices called memristors that perform some neural functions such as matrix multiplication up to 1,000 times faster than Si chips. However, first-generation cross-bar memristors mimic biological synapses as opposed to the overall neuron, which has limited their applicability in many neuromorphic computing applications. Thus, researchers are looking for alternative memristive devices (or neuristors) that mimic the whole neuron, especially the pulsing behavior of the axons that integrate all charges collected from thousands of synapses and fire a pulse to the post-synaptic neuron.

Therefore, a heretofore unaddressed need exists in the art to address the aforementioned deficiencies and inadequacies.

SUMMARY OF THE INVENTION

One of the objectives of this invention is to provide thermally activated memristors that are fabricated from composite films of solution-processed two-dimensional (2D) layered semiconductors. In contrast to the mechanism of defect migration in conventional memristors, their switching behavior is driven by thermally activated electrical discharge between nanosized flakes of the semiconductors. Since the constituent 2D semicondutors are processed in solution, these devices can be scalably manufactured at low cost with excellent reproducibility and stability.

In one aspect of the invention, the memristor includes a semiconductor film formed on a nanoporous membrane; and at least two electrodes spatial-apart formed on the semiconductor film and electrically coupled with the semiconductor film to define a channel in the semiconductor film between the at least two electrodes, wherein the channel has one or more filaments, one or more dendrite, or a combination of them formed in the semiconductor film.

In one embodiment, the prorous membrance comprises an anodized alumina (AAO) membrane with nanopores.

In one embodiment, the semiconductor film is a solution-processed semiconductor film. In one embodiment, the semiconductor film is formed from a surfactant-assisted aqueous dispersion of nanoflakes of a semiconductor.

In one embodiment, the underlying switching mechanism applies generally to a range of 2D semiconductors including, but not limited to, $MoS_2$, $MoSe_2$, $WS_2$, $ReS_2$, InSe, nanocomposites of van der Waals layered semiconductors, or a related 2D semiconductor material.

In one embodiment, the memristor is configured to operably switch from a first high resistance state (HRS1) to a low resistance state (LRS) at a voltage $V_{ON}$ when bias sweeping from zero to an absolute maximum voltage ($V_{MAX}$), and from the LRS back to a second high resistance state (HRS2) at a voltage $V_{OFF}$ when bias sweeping from the absolute maximum voltage ($V_{MAX}$) to zero, wherein a resistance ratio HRS1/HRS2 at zero bias is in a range of about 1.5-10, and a highest value of a HRS1/LRS switching ratio at the voltage $V_{OFF}$ exceeds 100.

In one embodiment, a ratio of power dissipation of the memristor at the voltages $V_{ON}$ and $V_{OFF}$ correlates with the resistance ratio HRS1/HRS2 at zero bias.

In one embodiment, an internal resistance of the memristor is changeable during switching.

In one embodiment, the memristor is a thermally activated memristor.

In one embodiment, the thermally activated memristor is characterized with switching behavior driven by thermally activated electrical discharge between the nanoflakes of the semiconductor.

In one embodiment, the switching behavior of the thermally activated memristor depends on a thickness, d, of the semiconductor film.

In one embodiment, d is less than about 800 nm, the thermally activated memristor is a soft thermistor memristor characterized with a dynamic negative differential resistance (NDR).

In one embodiment, d is in a range of about 0.8-3 µm, the thermally activated memristor is a hard thermistor memristor characterized with thermal runaway. In one embodiment, the channel includes the one or more filaments buried in the semiconductor film and bridging the two electrodes. In one embodiment, the channel further includes the one or more dendrites near electrodes edges without bridging the two electrodes.

In one embodiment, the hard thermistor memristor is operably convertible into a write-once-read-many (WORM) memory by either annealing the memristor at a temperature higher than an annealing temperature or by setting an instrument compliance ($I_{COMP}$) of the memristor larger than 10 mA.

In one embodiment, d is greater than about 3 the thermally activated memristor is a WORM memory characterized with an irreversible change in conduction by about $10^4$-fold. In one embodiment, the channel includes the one or more dendrites protruding from the channel surface by hundreds of nanometers and bridging the two electrodes.

In one embodiment, the at least two electrodes are formed of a same metallic material or different metallic materials.

In another aspect of the invention, a circuitry comprises one or more memristors as disclosed above.

In yet another aspect of the invention, an electronic device comprises one or more memristors as disclosed above.

In a further aspect of the invention, a method for fabricating a memristor comprises fabricating the composite film comprising a semiconductor film; annealing the composite film at an annealing temperature for a period of time; and depositing at least two electrodes spatial-apart on the annealed composite film to form the memristor, such that the at least two electrodes are electrically coupled with the semiconductor film to define a channel in the semiconductor film between the at least two electrodes, wherein the channel has one or more filaments, one or more dendrite, or a combination of them formed in the semiconductor film.

In one embodiment, the annealing temperature is in a range of about 220-380° C., and the period of time is in a range of about 10-50 minutes.

In one embodiment, the annealing step is performed in ambient.

In one embodiment, the rinsing step is performed with deionized water.

In one embodiment, the depositing step is performed by thermal evaporation, electron beam evaporation, or sputtering.

In one embodiment, the fabricating step comprises mixing powders of a semiconductor and an aqueous solution containing a surfactant to form a mixture thereof; ultrasonicating the mixture to form a dispersion; centrifuging the dispersion to remove unexfoliated semiconductor powders; decanting supernatant of the dispersion for film formation; and collecting the dispersion by vacuum filtration on a prorous membrance, and rinsing the collected dispersion to remove the surfactant; and subjecting the collected dispersion on the prorou membrane to thermal annealing to remove residual water as so to form the composite film having the semiconductor film on the prorous membrance, wherein the semiconductor film comprises nanoflakes of the semiconductor.

In one embodiment, the aqueous solution includes nonionic Pluronic surfactants or ionic sodium cholate surfactants in addition to surfactant-free ethanol-water co-solvent systems.

In one embodiment, the prorous membrance comprises an AAO membrane with nanopores.

In one embodiment, the semiconductor comprises, but not limited to, $MoS_2$, $MoSe_2$, $WS_2$, $ReS_2$, InSe, nanocomposites of van der Waals layered semiconductors, or a related 2D semiconductor material.

In one embodiment, the memristor is a thermally activated memristor. In one embodiment, depending upon a thickness of the semiconductor film, the memristor operably acts as a soft thermistor memristor, a hard thermistor memristor, or a WORM memory.

In one embodiment, the hard thermistor memristor is operably convertible into the WORM memory by either annealing the memristor at a temperature higher than the annealing temperature or by setting/comp of the memristor larger than 10 mA.

These and other aspects of the present invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The patent or application filed contains at least one drawing executed in color. Copies of this patent or patent application publication with color drawing(s) will be provided by the office upon request and payment of the necessary fee.

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 1A shows schematic of a lateral memristor fabricated on a vacuum-filtered $MoS_2$ film. FIG. 1B shows optical micrographs of lateral memristors from $MoS_2$ and $ReS_2$ films on anodized alumina membranes with area about 3.2 $cm^2$. FIG. 1C shows electron paramagnetic resonance (EPR) spectrum of a $MoS_2$ film showing a defect-related resonance peak at g=2.32. FIGS. 1D and 1E show depth-resolved X-ray photoelectron spectroscopy (XPS) showing Mo 3d peaks in annealed $MoS_2$ films before and after etching the top 3 nm by $Ar^+$ ions, respectively. FIG. 1F shows current-voltage (I-V) and current-field (I-E) characteristics of a $MoS_2$ memristor (channel length=100 µm) under vacuum with current compliance of about 2.05 mA. Bias sweeps follow the order 1, 2, 3, and 4 shown by arrows (0→50→0→−50→0 V). One hundred sequential I-V curves are shown in rainbow colors from violet ($1^{st}$) to red ($100^{th}$). $V_{ON}$ and $V_{OFF}$ are defined by the voltages where the current reaches compliance for sweep '1' and '2', respectively. The thermal runaway onset occurs at a threshold point $V_T$, $I_T$ (white circle). Voltage ramp rate=5 V s$^{-1}$. FIG. 1G shows log-linear plot of a MoS$_2$ I-V curve fitted with the thermal runaway model discussed in the text with exponent m=0.3. The inset shows a schematic of the gap between two flakes amplifying the local electric field by the large curvature of the top flake.

FIG. 2A shows I-V characteristics of a solution-processed MoS$_2$ memristor with only positive bias sweeps 1, 2, 3, 4 (0→50→0→50 V) reveal the difference between the first and third sweep, which corresponds to bipolar resistive switching. Subsequent sweeps (e.g., 3, 5, etc.) overlap each other. FIG. 2B shows I-V characteristics of the MoS$_2$ memristor acquired with ramp rates varying from about 0.5 to 25 V s$^{-1}$ with each curve acquired with a fixed voltage step of 0.5 V. The inset shows the exponential trend between ramp rate and $V_{ON}$. FIG. 2C shows I-V characteristics of the MoS$_2$ memristor with varying bias sweep range ($V_{MAX}$) from about 30 to 34 V showing a discontinuous change from a humped loop (30 V) to thermal runaway ($V_T$=31 V). The phase space between the red and black curves is experimentally unreachable. FIG. 2D shows current versus time (I-t) characteristics at a fixed voltage ($V_{HOLD}$) ranging from about 5 to 43 V in steps of 2 V. The inset shows a log-log plot of the same data. For $V_{HOLD}$>29 V, the current reaches compliance at time $t_{ON}$. FIG. 2E shows log-linear plot showing the exponential relationship between torr and $V_{HOLD}$. FIG. 2F shows post-measurement optical micrograph of a MoS$_2$ memristor showing a dendrite (1) and a filament (2) between the electrodes.

FIGS. 3A-3G illustrate optical and chemical analysis of filaments and dendrites, according to certain embodiments of the invention. FIG. 3A shows I-V characteristics of a 4.2 μm thick MoS$_2$ memristor showing write-once-read-many (WORM) behavior. The upper inset shows the same data in a log-linear plot. The voltage was ramped in 0.5 V steps each 100 ms (i.e., 5 V s$^{-1}$ ramp rate). The lower inset shows an optical micrograph captured from a video (33 frames s$^{-1}$) of dendrite formation during WORM switching shown by red dots (about 44.5-45.5 V) in the main plot. The red dashed line shows probe tips, and the white dashed lines show electrode edges. FIG. 3B shows XPS spectrum of a dendrite showing only the Mo$^{6+}$ (MoO$_3$) 3d doublet without any signal for the Mo$^{4+}$ (MoS$_2$) doublet. See FIG. 11E for the S 2p peak. FIG. 3C shows confocal PL spectra (excitation wavelength=532 nm) of a dendrite (1), a filament (2), and MoS$_2$ film (3). The filament and MoS$_2$ film signals are multiplied by 5 and 10 times, respectively, for visualization purposes. FIG. 3D shows bright-field optical micrograph of a MoS$_2$ memristor showing dendrites (1) and a filament (2) between two Au electrodes (yellow). FIG. 3E shows dark-field optical micrograph showing the dendrites, but not the buried filament. FIG. 3F shows spatial mapping of the S signal from time-of-flight secondary ion mass spectrometry (ToF-SIMS) showing S deficient darker regions for dendrites and the filament. ToF-SIMS analysis of the other elements Mo, Au, O is shown in FIGS. 12A-12F. FIG. 3G shows corresponding spatial photoluminescence (PL) mapping (at an emission wavelength of about 700 nm) revealing a strong PL signal at dendrites and a weaker PL signal at the filament. Scales bars in FIG. 3D-3G correspond to 50 μm. White dashed lines in FIG. 3F-3G show electrode edges.

FIGS. 4A and 4C show spatial mapping of the local temperature measured by an infrared video camera (30 frames s$^{-1}$) synchronized with I-V measurements (FIG. 4B) of a hard thermistor memristor in ambient conditions (ramp rate=10 V s$^{-1}$). Frames 1-6 were captured at six instances during the first electroforming sweep, as shown by the black circles in FIG. 4B. Frames 7-11 were captured during the second sweep, as shown by red circles in FIG. 4B. The white lines 410 and the red dashed lines 420 in frame 1 show the electrode edges of the biased device and neighboring device, respectively. The white arrows in frames 3 and 8 show the difference in temperature in the non-filamentary region during the first and second sweeps. The orange scale bar in frame 1 corresponds to 500 μm. FIG. 4D shows maximum local temperature (T) and current (I) are plotted against time for the second sweep. T values were extracted from 1200 images. FIG. 4E shows temperature mapping captured at seven instances from an infrared video showing competition between multiple hot-spots in a 4.2 μm thick MoS$_2$ WORM device. The white arrows in the leftmost frame show at least five hot-spots, where the top-most hot-spot develops into a dendrite T. Horizontal white dashed lines guide the eyes to the location of hot-spots i, ii, iii, and iv, where hot spots i, ii, and iv convert into dendrites. The emergence of different hot-spots roughly corresponds to the current discontinuities highlighted in FIG. 4F. The orange scale bar in the leftmost frame corresponds to 500 μm. All color legends shows temperature in Celsius (° C.).

FIG. 5A shows optical absorbance spectroscopy of the MoS$_2$ dispersion. FIG. 5B shows Raman spectra of the MoS$_2$ thin film using a Horiba Scientific XploRA PLUS Raman microscope at about 532 nm excitation (spot size about 1 μm$^2$). The signal was collected by a 100× objective (NA=0.9) and dispersed with a 2400 grooves mm$^{-1}$ grating. The gap between the $A_{1g}$ and $E^1_{2g}$ peak exceeds 23 cm$^{-1}$ and matches the gap from a MoS$_2$ bulk crystal [37]. FIG. 5C shows plot of vacuum-filtered film thickness versus volume of MoS$_2$ dispersion in surfactant Pluronic F68 and DI water. FIG. 5D shows bulk conductivity of pristine MoS$_2$ film measured at low biases (<2V in HRS1 state) versus film thickness. FIG. 5E shows a scanning electron microscope (SEM) image of a cross-section of a MoS$_2$ memristor. FIG. 5F shows zoomed-in image of the red rectangle from FIG. 5E.

FIGS. 6A-6B show Mo 3d peaks and S 2p peaks from an unetched film, respectively. FIGS. 6C-6D show Mo 3d peaks and S 2p peaks of the MoS$_2$ film after etching the top 3 nm with an Ar$^+$ ion gun (etch rate about 0.6 nm/s), respectively. FIGS. 6E-6F show Mo 3d peaks and S 2p peaks of the MoS$_2$ film after etching the top 27 nm, respectively.

FIGS. 7A-7B Mo 3d peaks from an annealed MoS$_2$ film after etching the top 6 nm and 27 nm, respectively. The unetched and 3 nm etched films are shown in insets of FIGS. 1D and 1E, respectfully. FIG. 7C S 2p peaks of annealed and unetched films. FIGS. 7D-7F S 2p peaks of the annealed film after etching the top 3 nm, 6 nm, and 27 nm, respectively.

FIG. 8 shows table of XPS peak positions, according to certain embodiments of the invention. XPS peak positions for the Mo 3d orbital, S 2s orbital, and S 2p orbital at different depths in unannealed and annealed $MoS_2$ films. All energies are in eV.

FIG. 9A shows zoomed-in current-voltage (I-V) characteristics a $MoS_2$ memristor from FIG. 1E showing a HRS1/HRS2 switching ratio about 3 near 0 V. FIG. 9B shows conductance-voltage (G-V) plot of a $MoS_2$ memristor showing HRS/LRS switching ratio of about 200 at $V_{OFF} \approx 13$ V. G=dI/dV. FIG. 9C shows I-V characteristics a $MoS_2$ memristor with current compliances of about 1 mA, 2 mA, and 5 mA. FIG. 9D shows characteristics a $MoS_2$ memristor at temperatures of about 350 K, 295 K, and 250 K, showing increasing $V_{ON}$ with decreasing temperature. Decreasing conductivity at low bias in sweep '1' is consistent with variable range hopping transport in the disordered composite film. FIG. 9E shows characteristics of the $MoS_2$ memristor from FIG. 2A with unipolar sweeps in the negative bias. The behavior is almost symmetric to unipolar sweeps in the positive bias shown in FIG. 2A. FIG. 9F shows characteristics of the $MoS_2$ memristor from FIG. 2B with different voltage sweep steps ranging from about 0.1 V to about 5 V while keeping the time interval of 100 ms fixed in each bias sweep.

FIG. 10A shows characteristics of a 0.5 μm thick $MoS_2$ film show a large negative differential resistance (NDR) feature in LRS with switching ratio about $10^4$ without a thermal runaway process. The plot shows 49 curves for different bias ranges from |10| V (violet) to |106| V (red) at a step of 2 V in the rainbow color scheme. Arrows show sweep direction. The inset (bias range=|106| V) shows another minor NDR feature in HRS with peaks around 3 V and −3 V. FIG. 10B shows log-log plot of the data from FIG. 10A showing power law behavior in different regimes. FIG. 10C shows voltage-time (V-t) and current-time (I-t) plots showing phase delay in current and voltage for a triangular waveform input voltage. Asymmetry in positive and negative biases corresponds to the asymmetric curves in FIG. 10A. The V-I phase delay of about 10 sec is the same order of magnitude as the longest time ($t_{ON}$) taken by hard thermistor memristors to switch to $I_{COMP}$ just above $V_T$ shown in FIG. 2D. FIG. 10D shows V-t and I-t plots for a sinusoidal input voltage waveform.

FIG. 11A shows optical micrograph from FIG. 2F showing a filament and a couple dendrites. FIG. 11B shows photoluminescence intensity mapping shows brighter regions in the dendrites than the filament. FIG. 11C shows AFM topography image from the region outlined by the dashed black rectangle in FIG. 11A reveals no height contrast for the filament. FIG. 11D shows corresponding phase image reveals minimal phase contrast for the filament. FIG. 11E shows XPS spectrum of a dendrite corresponding to FIG. 3B, which shows no signal for the S 2p peak, in agreement with the deficiency of S from SIMS and photoluminescence mapping in FIGS. 3A-3G.

FIGS. 12A-12F show ToF-SIMS characteristics of filaments and dendrites, according to certain embodiments of the invention. FIG. 12A shows bright-field optical micrograph of a hard thermistor memristor showing one filament and several dendrites (reproduced from FIG. 3D). FIG. 12B shows spatial mapping of the ToF-SIMS signal for Au, which reveals the location of the Au electrodes. FIG. 12C shows spatial mapping of the ToF-SIMS signal for S, showing S deficiency in the filament and dendrites. FIG. 12D shows spatial mapping of ToF-SIMS signal for Mo. The scale bars in FIGS. 12A-12D correspond to 100 μm. FIG. 12E shows optical micrograph of a WORM device, showing a dendrite bridging the electrodes. A portion of the electrodes was destroyed during the sparking event of dendrite formation. FIG. 12F shows spatial mapping of the ToF-SIMS signal for Mo shows enrichment of Mo in the dendrite and under the electrode. The scale bars in FIGS. 12E-12F correspond to 50 μm.

FIGS. 13A-13C show generalization of memristive behavior in solution-processed 2D films, according to certain embodiments of the invention. FIG. 13A shows I-V characteristics of a $WS_2$ film memristor prepared with a non-ionic F-68 surfactant. FIG. 13B shows I-V characteristics of an InSe film memristor prepared with an ethanol-water co-solvent system. FIG. 13C shows I-V characteristics of a $ReS_2$ film memristor prepared using an ionic sodium cholate surfactant [38].

DETAILED DESCRIPTION OF THE INVENTION

Figure 1A:
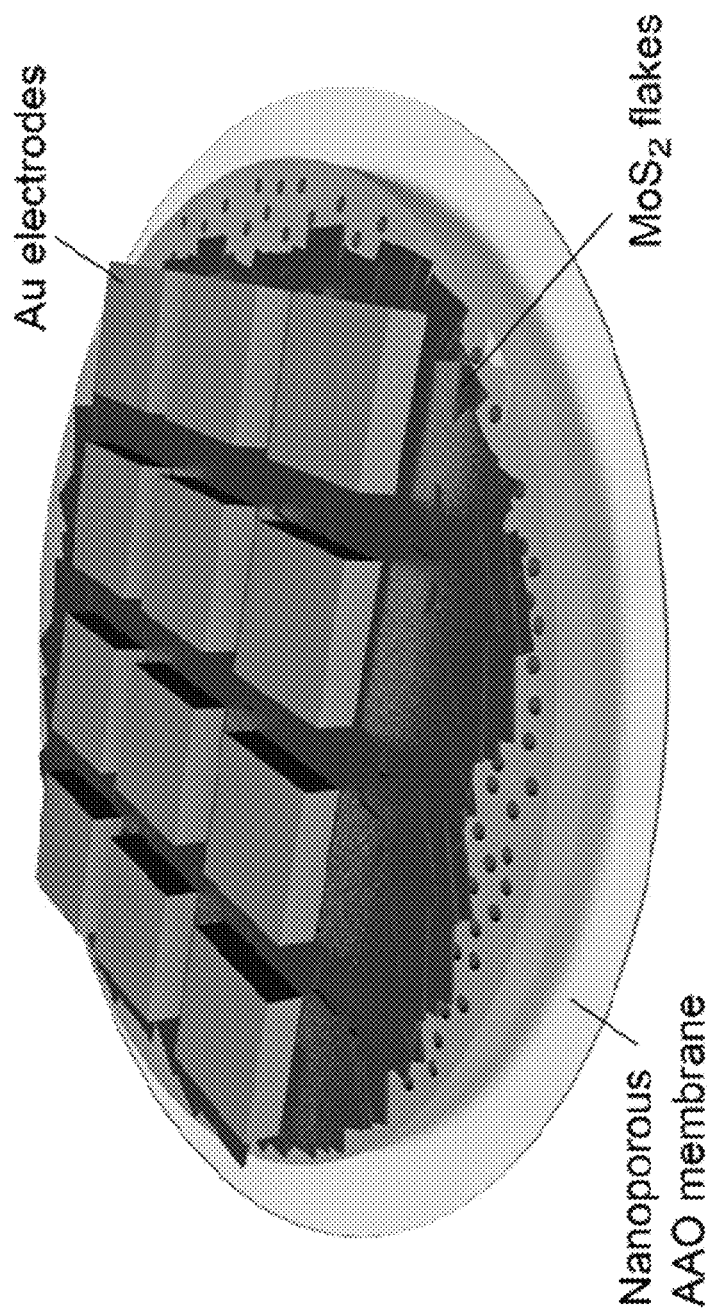
FIGS. 1A-1G illustrate architecture and current-voltage characteristics of solution-processed $MoS_2$ memristors, according to certain embodiments of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this invention will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this invention, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

As used in this invention, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this disclosure, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Non-linear dynamical systems such as neuristors, originally conceptualized in thermistors [1] and recently realized in Mott memristors [2,3], embody the essential complexity in spike-timing behavior that is required for beyond-von Neumann computing architectures [4-6]. Meanwhile, emerging two-dimensional (2D) materials such as $MoS_2$ show resistive switching at low fields [7], gate-tunable memristive responses [8], multi-terminal memtransistors [9], multi-bit memory [10], flexible resistive random-access memory [11], and switching in sub-nanometer-thick atomistors [12]. Furthermore, solution-processed 2D material films possess versatile chemical tailoring, compositional tunability, mechanical flexibility, and compatibility with large-area printed electronics [13,14]. In certain aspects, this invention shows all-or-nothing spiking behavior in solution-processed $MoS_2$ memristors, and unravels the switching mechanism by in-situ spatially-resolved electrical, optical, chemical, and thermal analyses. Three classes of switching phenomena such as soft switching with negative differential resistance, hard switching with thermal runaway, and irreversible switching are correlated with the direct observation of filaments and dendrites. This resistive switching is generalized to a wide range of solution-processed 2D semiconductor films including, but not limited to, $MoS_2$, $WS_2$, $ReS_2$, and InSe at ultralow macroscopic fields (about 4 kV $cm^{-1}$), which is explained by thermally activated electrical discharge. Overall, this invention discloses solution-processed 2D semiconductor films as a platform for additive manufacturing of large-area thermally activated memristors, and suggests temperature as a new state variable to realize neuristors, Hodgkin-Huxley axons, random number generators, and chaotic circuits.

In one aspect of the invention, the memristor includes a semiconductor film formed on a nanoporous membrane; and at least two electrodes spatial-apart formed on the semiconductor film and electrically coupled with the semiconductor film to define a channel in the semiconductor film between the at least two electrodes. The channel has one or more filaments, one or more dendrite, or a combination of them formed in the semiconductor film. The at least two electrodes are formed of a same metallic material or different metallic materials.

In one embodiment, the prorous membrance comprises an anodized alumina (AAO) membrane with nanopores. It should be appreciated to one skilled in the art that any membrane can be utilized to practice the invention, as long as they are stable up to 250 C. Membrane is just a filer to prepare the film.

In one embodiment, the semiconductor film is a solution-processed semiconductor film formed from a surfactant-assisted aqueous dispersion of nanoflakes of a semiconductor.

In one embodiment, the underlying switching mechanism applies generally to a range of 2D semiconductors including, but not limited to, $MoS_2$, $MoSe_2$, $WS_2$, $ReS_2$, InSe, nanocomposites of van der Waals layered semiconductors, or a related 2D semiconductor material.

In one embodiment, the memristor is configured to operably switch from a first high resistance state (HRS1) to a low resistance state (LRS) at a voltage $V_{ON}$ when bias sweeping from zero to an absolute maximum voltage ($V_{MAX}$), and from the LRS back to a second high resistance state (HRS2) at a voltage $V_{OFF}$ when bias sweeping from the absolute maximum voltage ($V_{MAX}$) to zero, where a resistance ratio HRS1/HRS2 at zero bias is in a range of about 1.5-10 and a highest value of a HRS1/LRS switching ratio at the voltage $V_{OFF}$ exceeds 100.

In one embodiment, a ratio of power dissipation of the memristor at the voltages $V_{ON}$ and $V_{OFF}$ correlates with the resistance ratio HRS1/HRS2 at zero bias.

In one embodiment, an internal resistance of the memristor is changeable during switching.

In one embodiment, the memristor is a thermally activated memristor that is characterized with switching behavior driven by thermally activated electrical discharge between the nanoflakes of the semiconductor.

In one embodiment, the switching behavior of the thermally activated memristor depends on a thickness, d, of the semiconductor film.

In one embodiment, d is less than about 800 nm, the thermally activated memristor is a soft thermistor memristor characterized with a dynamic negative differential resistance (NDR).

In one embodiment, d is in a range of about 0.8-3 µm, the thermally activated memristor is a hard thermistor memristor characterized with thermal runaway. In the hard thermistor memristor, the channel includes the one or more filaments buried in the semiconductor film and bridging the two electrodes. Additionally, the channel may further include the one or more dendrites near electrodes edges without bridging the two electrodes.

The hard thermistor memristor is operably convertible into a write-once-read-many (WORM) memory by either annealing the memristor at a temperature higher than an annealing temperature or by setting an instrument compliance ($I_{COMP}$) of the memristor larger than 10 mA.

In one embodiment, d is greater than about 3 µm, the thermally activated memristor is a WORM memory characterized with an irreversible change in conduction by about $10^4$-fold. In one embodiment, the channel includes the one or more dendrites protruding from the channel surface by hundreds of nanometers and bridging the two electrodes.

In another aspect of the invention, a circuitry comprises one or more memristors as disclosed above.

In yet another aspect of the invention, an electronic device comprises one or more memristors as disclosed above.

In a further aspect of the invention, a method for fabricating a memristor comprises fabricating the composite film comprising a semiconductor film; annealing the composite film at an annealing temperature for a period of time; and depositing at least two electrodes spatial-apart on the annealed composite film to form the memristor, such that the at least two electrodes are electrically coupled with the semiconductor film to define a channel in the semiconductor film between the at least two electrodes, where the channel has one or more filaments, one or more dendrite, or a combination of them formed in the semiconductor film.

In one embodiment, the annealing temperature is in a range of about 220-380° C., and the period of time is in a range of about 10-50 minutes.

In certain embodiments, the annealing step is performed in ambient; the rinsing step is performed with deionized water; and the depositing step is performed by thermal evaporation, electron beam evaporation, or sputtering.

In one embodiment, the fabricating step comprises mixing powders of a semiconductor and an aqueous solution containing a surfactant to form a mixture thereof; ultrasonicating the mixture to form a dispersion; centrifuging the dispersion to remove unexfoliated semiconductor powders; decanting supernatant of the dispersion for film formation; and collecting the dispersion by vacuum filtration on a prorous membrance, and rinsing the collected dispersion to remove the surfactant; and subjecting the collected dispersion on the prorou membrane to thermal annealing to remove residual water as so to form the composite film having the semiconductor film on the prorous membrance, where the semiconductor film comprises nanoflakes of the semiconductor.

In one embodiment, the aqueous solution includes non-ionic Pluronic surfactants or ionic sodium cholate surfactants in addition to surfactant-free ethanol-water co-solvent systems.

In one embodiment, the prorous membrance comprises an AAO membrane with nanopores. It should be appreciated to one skilled in the art that any membrane can be utilized to practice the invention, as long as they are stable up to 250 C. Membrane is just a filer to prepare the film.

In one embodiment, the semiconductor comprises, but not limited to, $MoS_2$, $MoSe_2$, $WS_2$, $ReS_2$, InSe, nanocomposites of van der Waals layered semiconductors, or a related 2D semiconductor material.

In one embodiment, the memristor is a thermally activated memristor. In one embodiment, depending upon a thickness of the semiconductor film, the memristor operably acts as a soft thermistor memristor, a hard thermistor memristor, or a WORM memory.

In one embodiment, the hard thermistor memristor is operably convertible into the WORM memory by either annealing the memristor at a temperature higher than the annealing temperature or by setting $I_{COMP}$ of the memristor larger than 10 mA.

According to the invention, the resulting thermally activated memristors better mimic the whole neuron compared to the prior art, thus holding promise for applications in the fields including, but not limited to, neuromorphic computing architectures, neuristors, nonvolatile memory, chaotic circuits, and random number generators.

In addition, among other things, the invention has at least the following advantages over the existing technology. First, the memristors according to the invention are based on thermally activated electrical discharge. However, most existing memristors to date are based on the mechanism of defect migration. Second, the all-or-nothing response in the memristors according to the invention was previously achieved only in Mott memristors that switch at a local temperature of about 800° C., whereas the invented memristor switches at temperatures below 200° C. Third, Mott memristors require well controlled $NbO_2$ thin films and cleanroom fabrication, whereas the memristors according to the invention use low-cost solution-processed materials in ambient conditions.

These and other aspects of the present invention are further described below. Without intent to limit the scope of the invention, exemplary instruments, apparatus, methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Figures 1D, 1E:
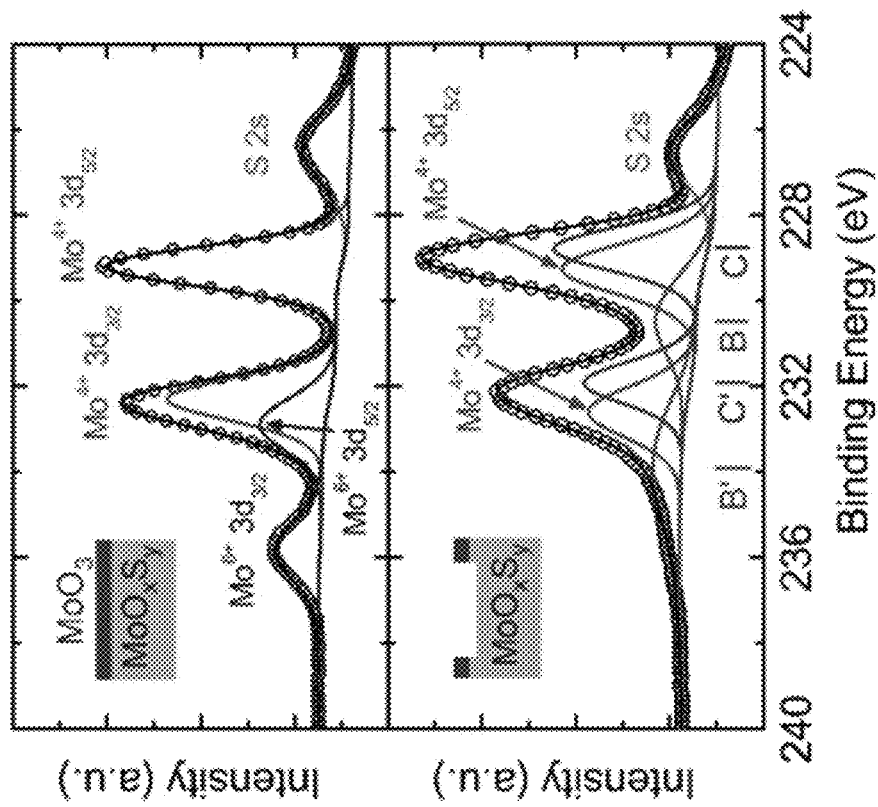
Figures 1B, 1C:
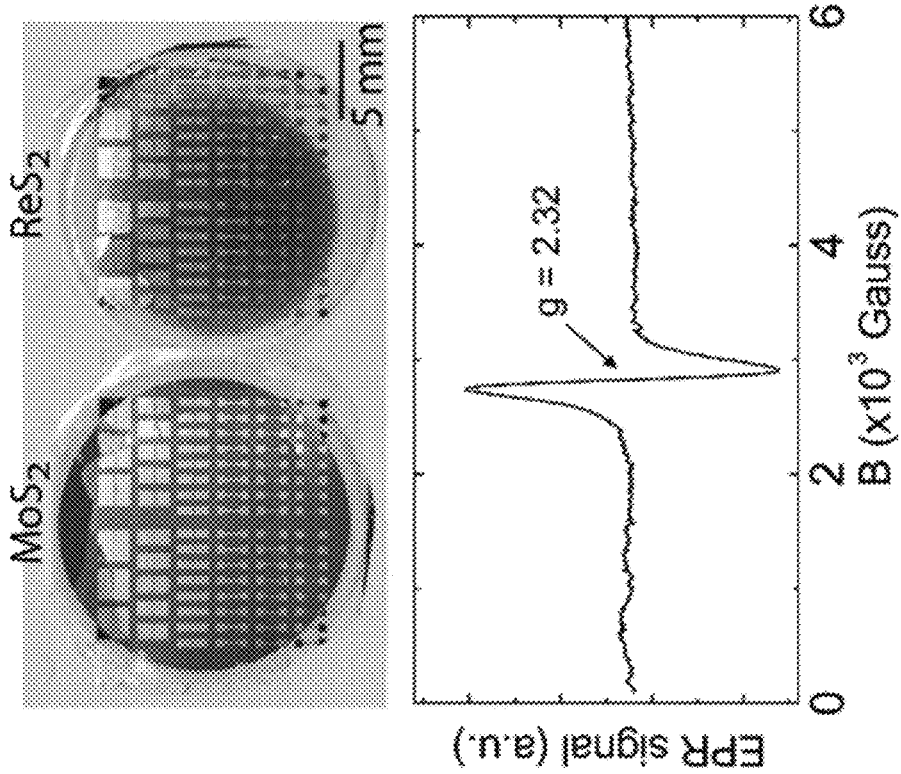
Figure 5A:
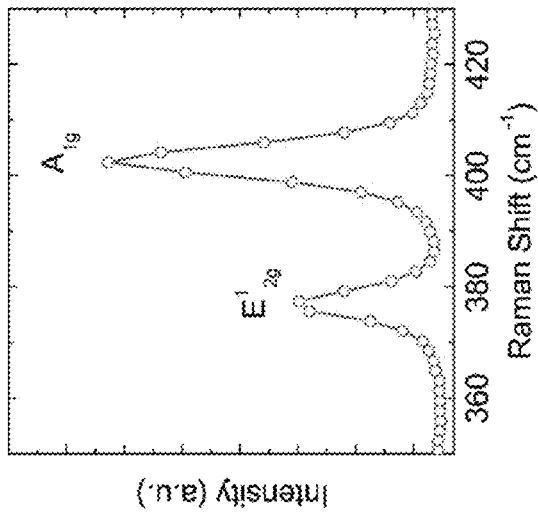
FIGS. 5A-5F show materials characterization of the MoS$_2$ film, according to certain embodiments of the invention.
Figure 5B:
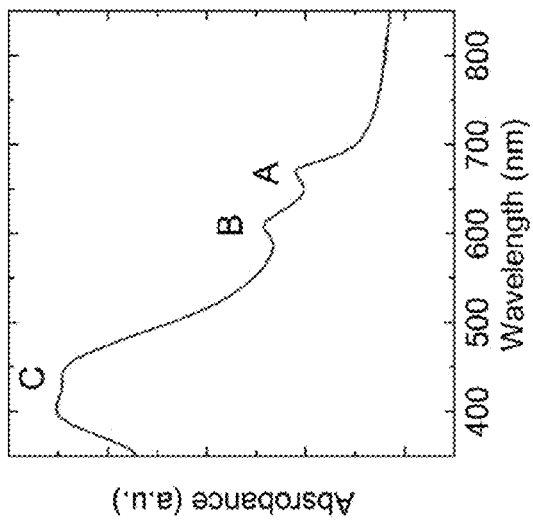
Figure 5C:
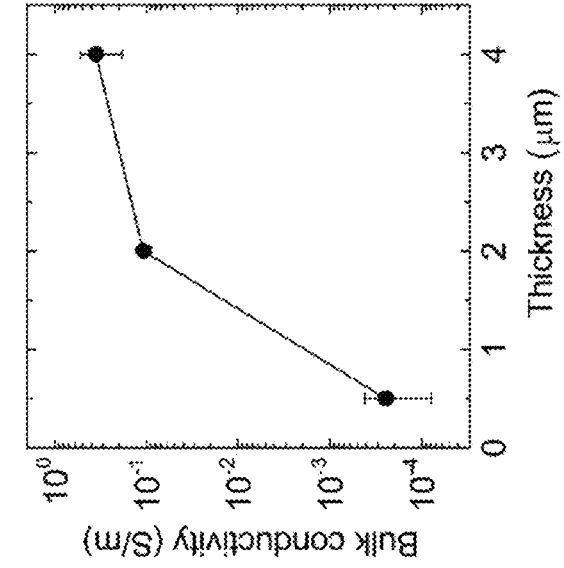
Figure 5D:
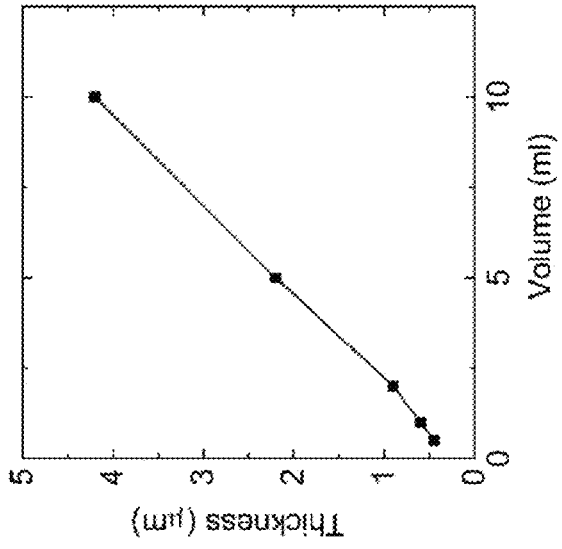
Figures 5E, 5F:
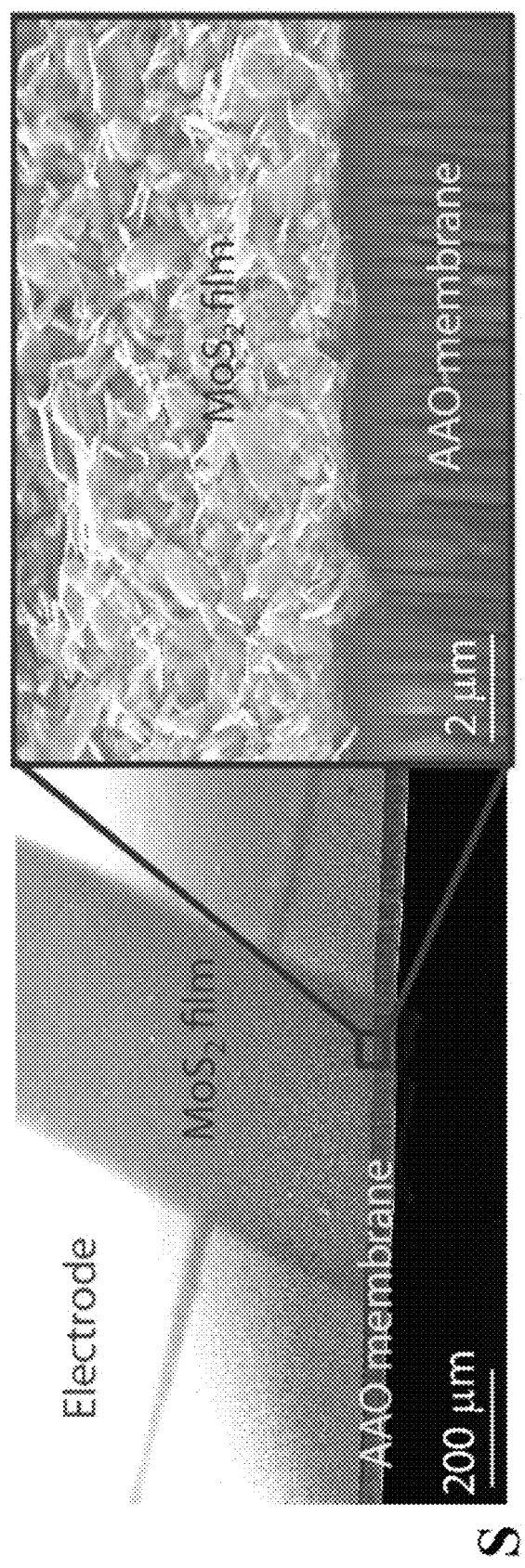
Figure 6B:
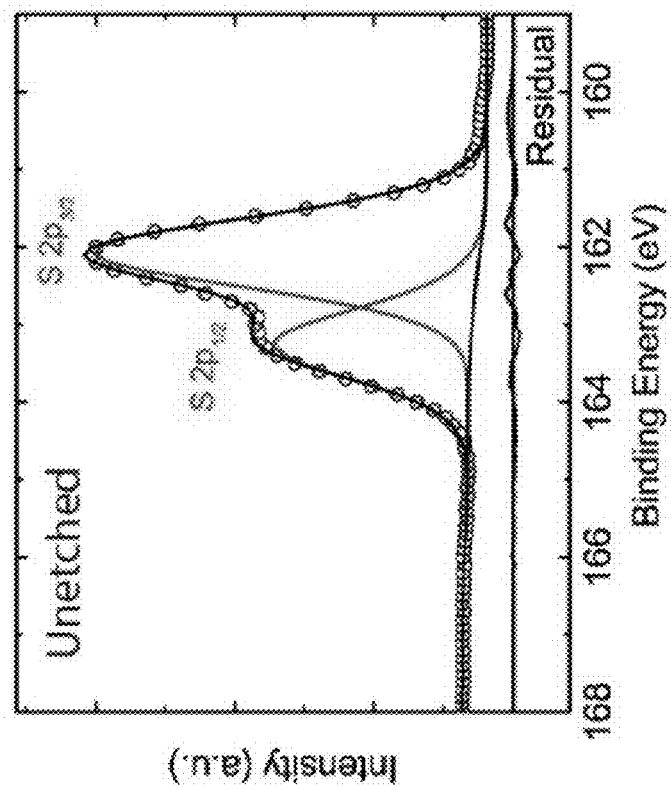
FIGS. 6A-6F show depth-resolved XPS spectra of unannealed MoS$_2$ films, according to certain embodiments of the invention.
Figure 6A:
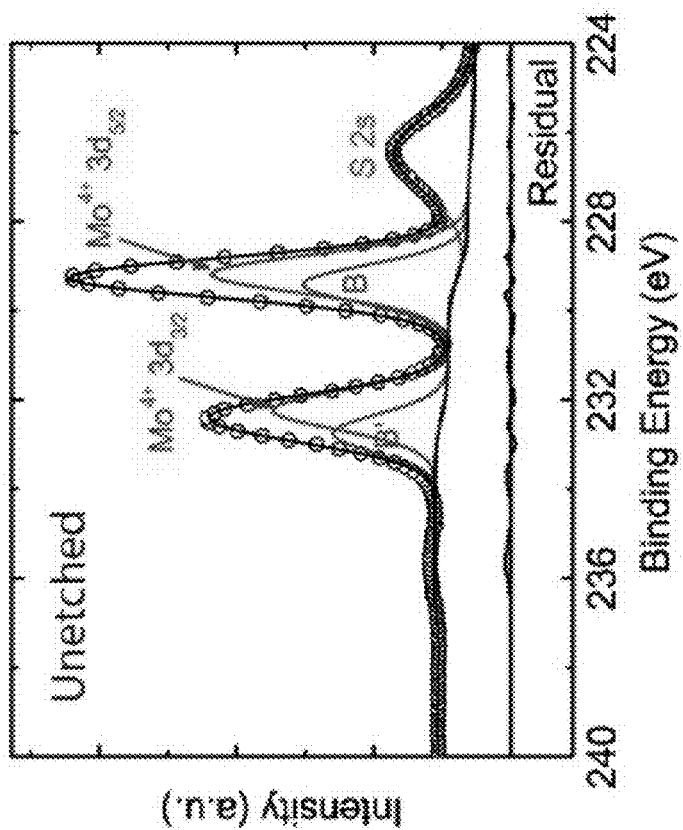
Figure 6D:
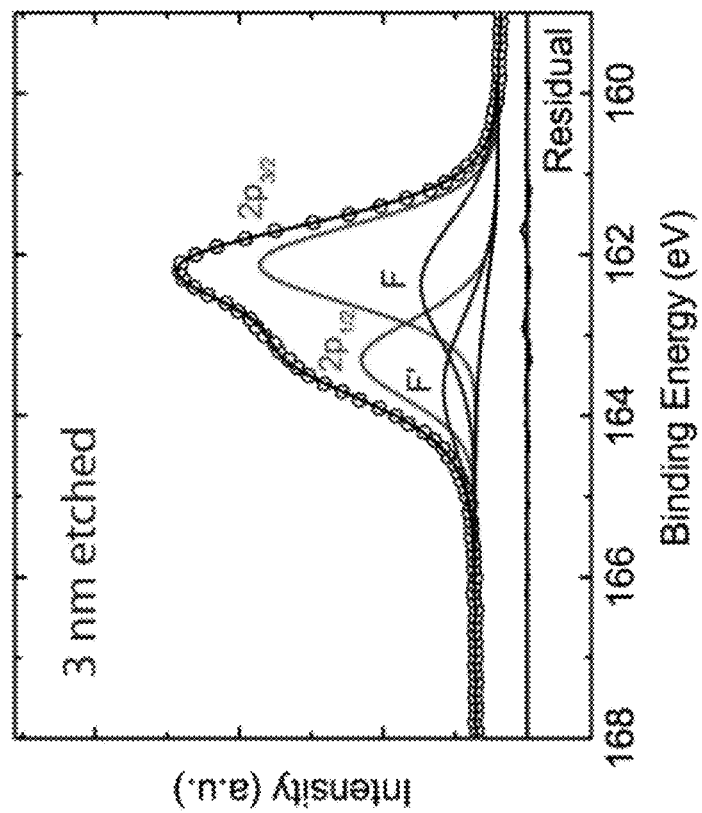
Figure 6C:
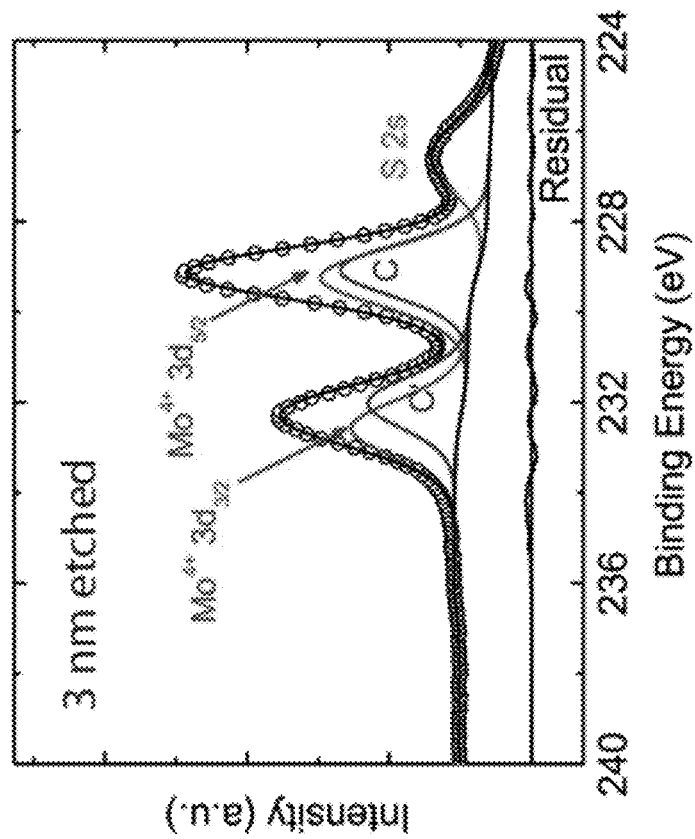
Figure 6F:
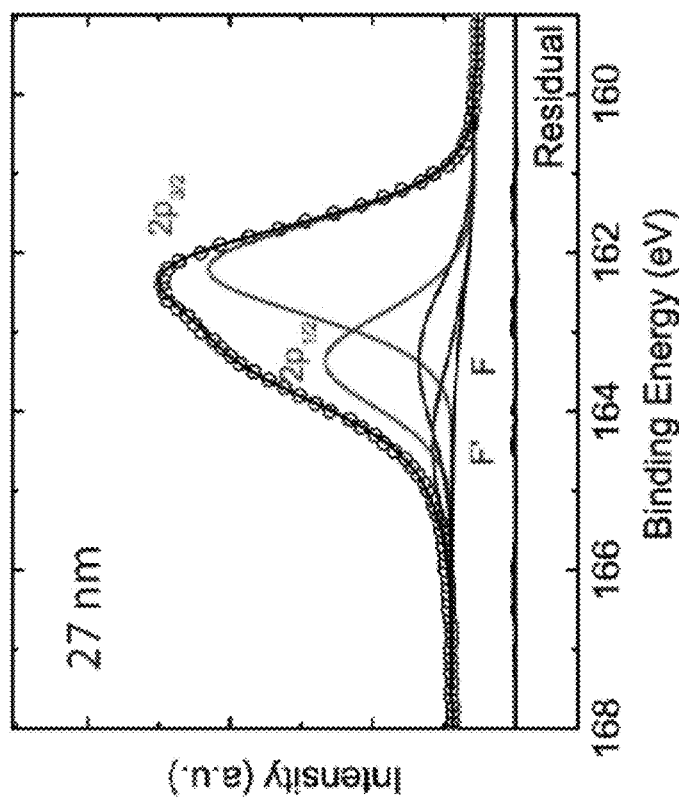
Figure 6E:
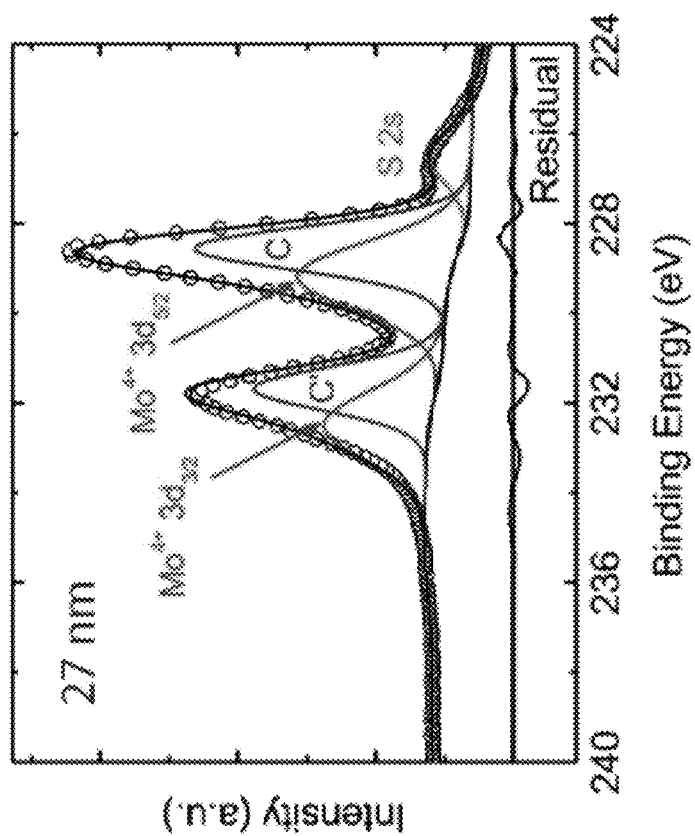
Figure 7B:
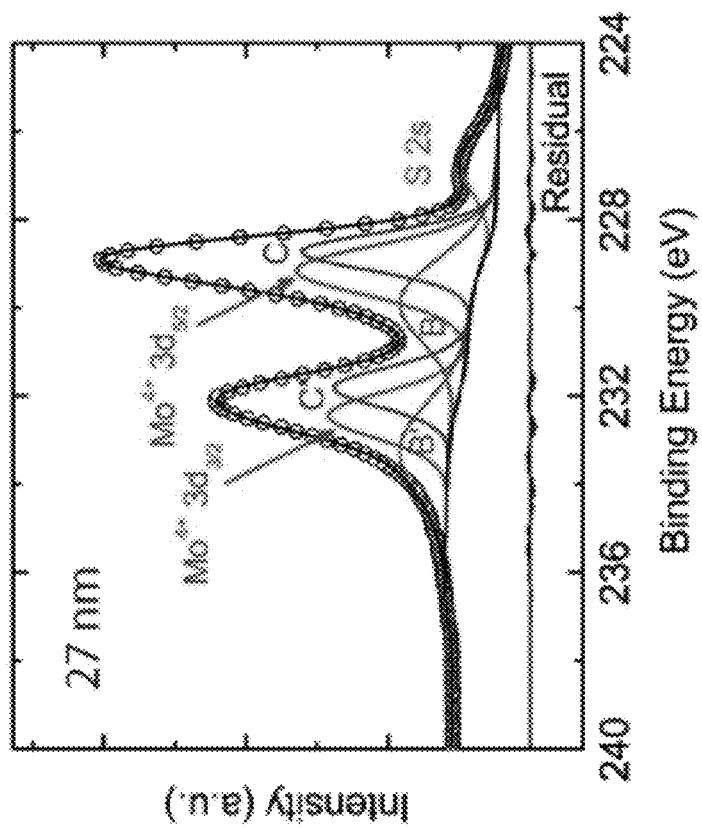
FIGS. 7A-7F show depth-resolved XPS spectra of annealed MoS$_2$ films, according to certain embodiments of the invention.
Figure 7A:
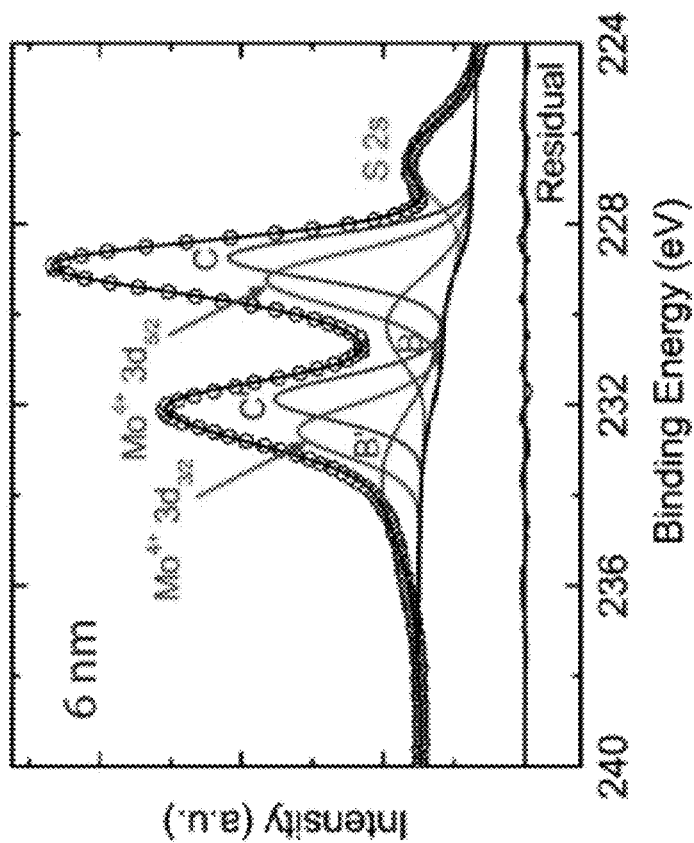
Figure 7D:
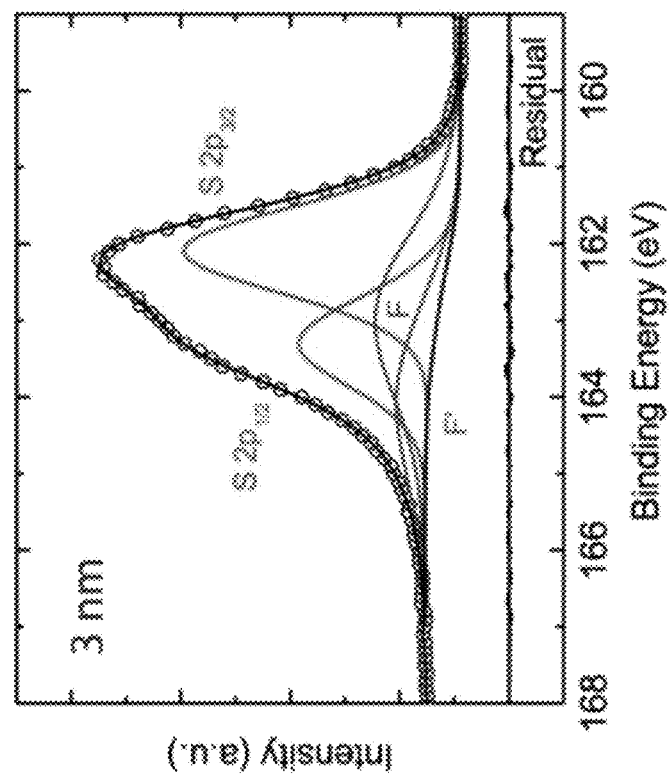
Figure 7C:
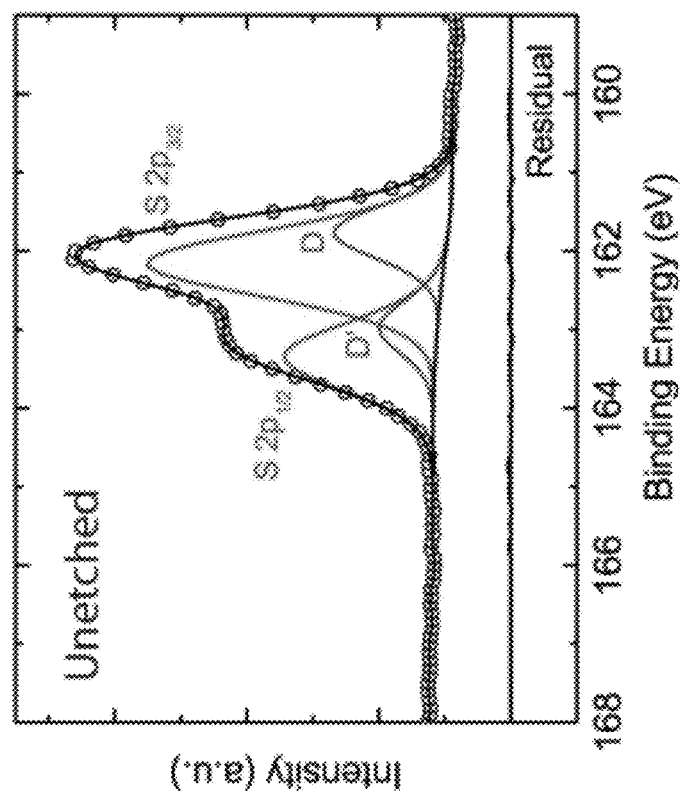
Figure 7F:
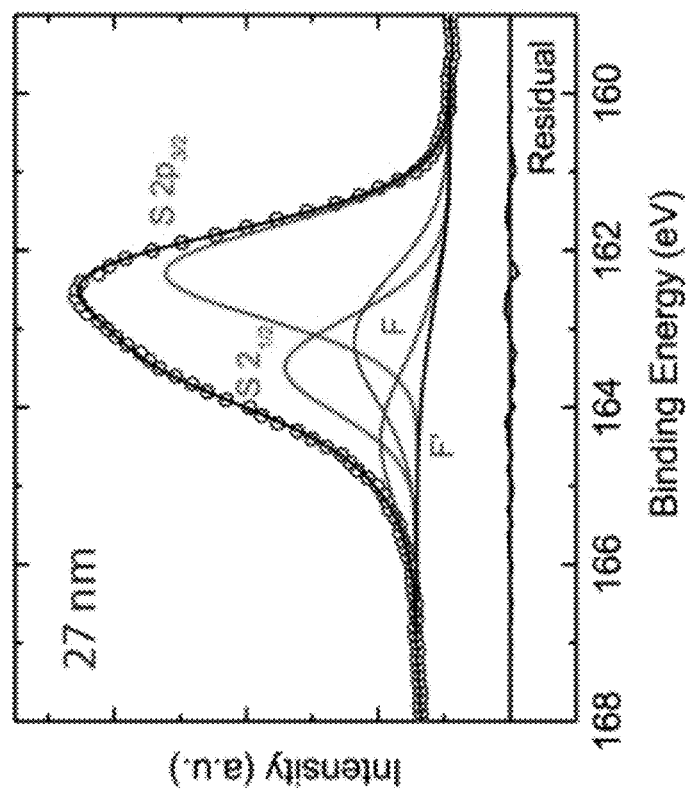
Figure 7E:
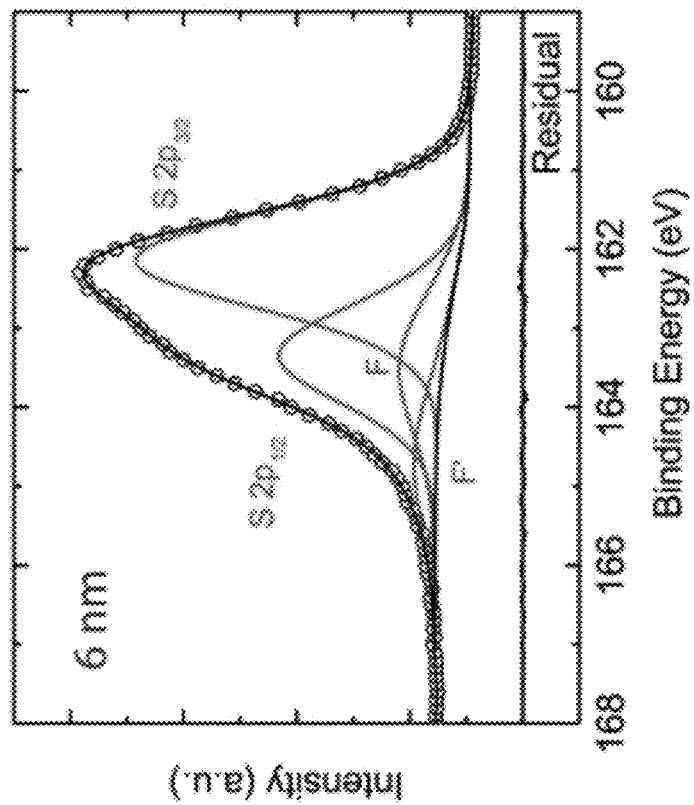

Thermally Activated Memristors from Solution-Processed Two-Dimensional Semiconductors In the exemplary examples, lateral $MoS_2$ memristors are fabricated from vacuum-filtered films prepared from a surfactant-assisted aqueous dispersion of $MoS_2$ nanoflakes, as shown in FIGS. 1A-1B [14,15]. This methodology yields centimeter-scale uniform films with controlled thickness, as shown in FIGS. 5E-5F. Subsequently, thermal annealing for about 30 min at about 250° C. in ambient conditions was found to be critical for achieving memristive switching in $MoS_2$ films as has been observed in previous $MoS_2$ memristors [7]. The high crystallinity of the $MoS_2$ nanoflakes is confirmed by Raman spectroscopy, as shown in FIG. 5B. Electron paramagnetic resonance (EPR) spectra from the electrically conducting $MoS_2$ films show a resonance peak at a magnetic field B=2,830 Gauss, as illustrated in FIG. 1C. From g=hv/βB, where β is Bohr magnetron ($9.274\times10^{-24}$ J $T^{-1}$), his Plank constant, and v is the frequency of the microwave probe (9.15 GHz), a value of g=2.32 is calculated, which is consistent with g=2−(−6λ/Δ)=2.314 obtained from early EPR studies of doped $MoS_2$ crystals [16], where λ (about 0.1 eV) is the spin-orbit splitting for holes and Δ (about 1.9 eV) is the difference between Mo $d_z^2$ and $d_{xy}$ levels. The negative sign in the factor (−6λ/Δ) suggests that the $MoS_2$ is doped with defect energy levels lying close to the valence band. It should also be noted that the bulk electrical conductivity of the $MoS_2$ films is improved by three orders of magnitude to 0.1-0.2 S $m^{-1}$ upon annealing, which outperforms previous solution-processed $MoS_2$ films [11, 17-19] and is attributed to partial oxidation of the constituent $MoS_2$ nanoflakes. Depth-resolved X-ray photoelectron spectroscopy (XPS) of annealed and unannealed $MoS_2$ films reveals that the $MoS_2$ nanoflakes are fully oxidized to $MoO_3$ within the top 3 nm of the annealed $MoS_2$ film while the bulk of the film includes oxysulfide species, as shown in FIGS. 1D-1E, 6A-6F, 7A-7F and 8 [20]. The measured electrical conductivity of annealed films depends strongly on the film thickness, which rules out shorting by the $MoO_3$ coating and implies that the bulk of the film dominates the charge transport characteristics, as shown in FIGS. 5A-5F.

Preparation of $MoS_2$ Dispersion and Composite Films

First, 2 g of $MoS_2$ powder (American Elements) and 100 mL of 0.5% w $v^{-1}$ Pluronic F68 aqueous surfactant solution were placed in a 120 mL stainless steel beaker. Then, the mixture was ultrasonicated (Fisher Scientific Model 500 Sonic Dismembrator) with a 0.5-inch diameter flat tip for 1 hour at a power level of about 60% (about 100 W) in an ice bath. The $MoS_2$ dispersion was centrifuged at 7,500 rpm (Avanti J-26 XP, Beckman Coulter) for 10 min to remove the unexfoliated $MoS_2$ powder. Following centrifugation, the supernatant of the dispersion was carefully decanted to use for film formation. The $MoS_2$ dispersion was collected by vacuum filtration on an anodized alumina (AAO) membrane with about 20 nm pore size and rinsed with about 50 mL of deionized water to remove the surfactant. The collected $MoS_2$ dispersion on the AAO membrane was subjected to thermal annealing at about 80° C. for about 1 min to dry the residual water and enhance $MoS_2$ film integrity.

Device Fabrication and Electrical Measurements

Lateral memristors were fabricated by first annealing the $MoS_2$ film at about 250° C. for about 30 min on a hot plate in ambient. The annealing step is critical in improving the conductivity of the film by up to 1000× and realizing memristor switching. Device fabrication was completed by depositing about 70 nm Au thick electrodes on annealed films by thermal evaporation (Kurt J. Lesker Nano 38) through shadow masks.

All vacuum electrical measurements were performed at a pressure less than $2\times10^{-4}$ Torr using a LakeShore CRX 4K probe station coupled with a Keithley 4200A-SCS parameter analyzer and source-meter. Variable temperature electrical measurements were conducted in the same setup. Ambient electrical measurements were performed either in an ambient probe station (Cascade Microtech, Inc.) or a lab-built device testing setup (for in-situ optical and infrared imaging).

Optical, Raman, Photoluminescence, and Scanning Probe Characterization

Optical absorbance spectra of the $MoS_2$ dispersions were measured using a Cary 5000 spectrophotometer (Agilent Technologies). A plastic cuvette with 1 cm path length was used for the measurement, and the baseline from the surfactant solution was subtracted from the spectra. Confocal Raman and photoluminescence (PL) microscopy was performed in a Horiba Scientific XploRA PLUS Raman microscope with an excitation wavelength of about 532 nm. Photoluminescence excitation (PLE) spectra were collected from $MoS_2$ films using a Horiba Fluorolog-3 spectrofluorometer. Atomic force microscopy (AFM) of memristors was performed in an Asylum Cypher AFM system in tapping mode using NanoWorld NCHR-W Si cantilevers (resonant frequency about 320 kHz). The thickness of $MoS_2$ films and height of dendrites were measured using a Veeco Dektak 150 surface profiler.

X-Ray Photoelectron Spectroscopy (XPS)

XPS measurements were performed using a high vacuum Thermo Scientific ESCALAB 250 Xi+ XPS system at a base pressure of about $1\times10^{-9}$ Torr using an Al Kα X-ray source (about 1486.6 eV) with a 500 μm spot size and a 0.1 eV binding energy resolution. All core-level spectra presented were the average of five scans taken with a dwell time of 50 ms and a pass energy of 50 eV. Samples were charge compensated using a flood gun, and all core-level spectra were charge corrected to adventitious carbon at about 284.8 eV. All subpeaks were fit using the software suite Avantage (Thermo Scientific) using fixed amplitude ratios between spin splits. Depth profiling was conducted on the $MoS_2$ film by using a 3 keV $Ar^+$ ion gun (with a calculated etch rate of about 0.6 nm/s) [31,32].

XPS revealed the role of thermal annealing in changing the stoichiometry of the solution-processed $MoS_2$ film. XPS spectra of the as-prepared (unannealed) $MoS_2$ film show 3d doublets from $Mo^{4+}$ ($MoS_2$) at 229.2 eV and 232.2 eV (FIGS. 6A-6F and 7A-7F) [33,34]. In contrast, the annealed $MoS_2$ film shows significant 3d doublets from $Mo^{6+}$ ($MoO_3$) at 232.9 eV and 235.8 eV in addition to $Mo^{4+}$ doublets at ($MoS_2$) at 229.2 eV and 232.3 eV (FIGS. 1D and 8), suggesting oxidation of $MoS_2$ [33]. XPS spectra show S 2p doublets accompanied by a doublet (D/D') that has been assigned to $S^{2-}$ ions (FIG. 6D), further confirming oxidized Mo [35]. Both unannealed and annealed $MoS_2$ films were etched by $Ar^+$ ions in steps of 3 nm (i.e., for 5 seconds with an etch rate of about 0.6 nm/s), and full XPS analysis was conducted after each etching step. Depth-resolved XPS analysis of the unannealed films shows the dominance of $Mo^{4+}$ peaks, as shown in FIGS. 6A-6F, in the spectra from the surface (unetched) and bulk (etched). The B and B' doublet is only seen in the unannealed film before etching and the annealed film after etching. BB' peaks have been assigned to $Mo^{5+}$ that has no counterparts in pure $MoS_2$ or $MoO_3$, although one report correlated it with $MoS_3$ [35]. Overall, the XPS spectra remain relatively unchanged at all 9 consecutive etches from 3 nm to 27 nm, as shown in FIGS. 6A-6F.

On the other hand, depth-resolved XPS analysis of the annealed films shows that full oxidation of Mo is concentrated in the top about 3 nm of the films, while oxysulfide species are present in the bulk portion of the film, as shown in FIG. 1D. XPS analysis provides deeper insight into the stoichiometry of molybdenum oxysulfide in the annealed film. Here, an additional doublet (C and C') is shown. This splitting of the $Mo^{4+}$ doublets has been assigned to defective regions in sub-stoichiometric $MoS_2$ grown by CVD [34]. The emergence of the small C/C' doublet in the unannealed film could also be explained by $Ar^+$ beam induced reduction (FIGS. 6A-6F and 7A-7F) [36]. Depth-resolved XPS of the S 2p orbitals shows the disappearance of the D/D' doublet and the emergence of a new doublet (F/F') on the other side of S 2p doublet that has been assigned to $(S_2)^{2-}$ ions (FIGS. 7A-7F) [35]. The XPS spectra of the annealed film also remain relatively unchanged at all 9 consecutive etches from 3 nm to 27 nm, suggesting relatively uniform stoichiometry of oxysulfide species in the bulk of the film, as shown in FIGS. 7A-7F.

Time-of-Flight Secondary Ion Mass Spectrometry (ToF-Sims), Electron Paramagnetic Resonance (EPR), and Impedance Spectroscopy ToF-SIMS measurements were carried out with a PHI TRIFT III ToF-SIMS (Physical Electronics) instrument equipped with a gallium liquid metal ion gun in the negative ion mode. The analysis chamber pressure was kept at about $1\times10^{-9}$ Torr. The EPR spectra were recorded using a modified VARIAN E4, EPR X-band spectrometer. Impedance spectroscopy data were acquired over a frequency range of 1 Hz to 1 MHz using a Solartron Model 1260A impedance/gain-phase analyzer. The oscillation amplitude did not exceed 100 mV. The lateral memristor, housed in a home-built wire-bonding setup, was kept in a Faraday cage to minimize external interference at low frequency.

In-Situ Infrared Imaging and Video

An Optotherm Micro Thermal Imaging System was used to obtain in-situ infrared images by measuring temperature variations with time. A 10 micron camera lens with high calibration range and 10K Thermistor with a 20° C. set-point were used on the Thermalyze software suite. In-situ videos of blue light emission in WORM devices were captured using a Si CCD camera coupled to the vacuum probe station via a 7× telescope lens system at a rate of 33 frames per second.

Results and Discussions

Figures 1F, 1G:
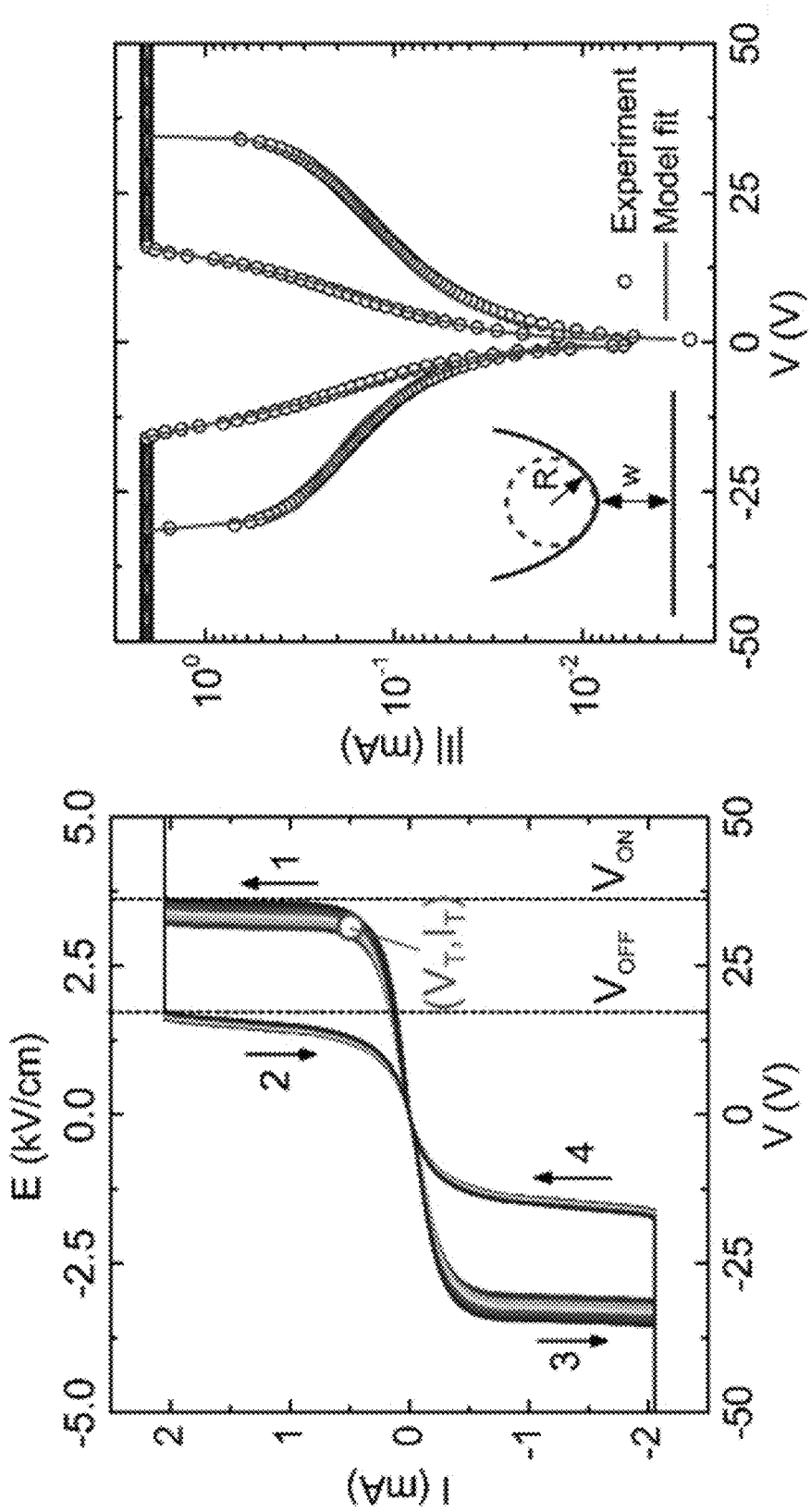
Figure 9B:
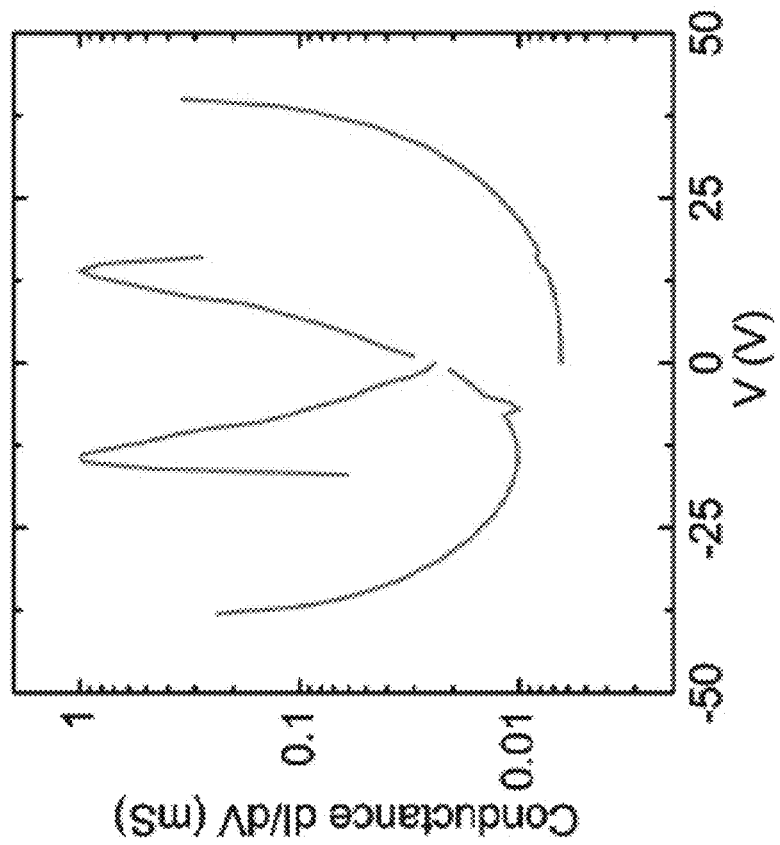
FIGS. 9A-9F show characteristics of 2 μm thick hard thermistor memristors, according to certain embodiments of the invention.
Figure 9A:
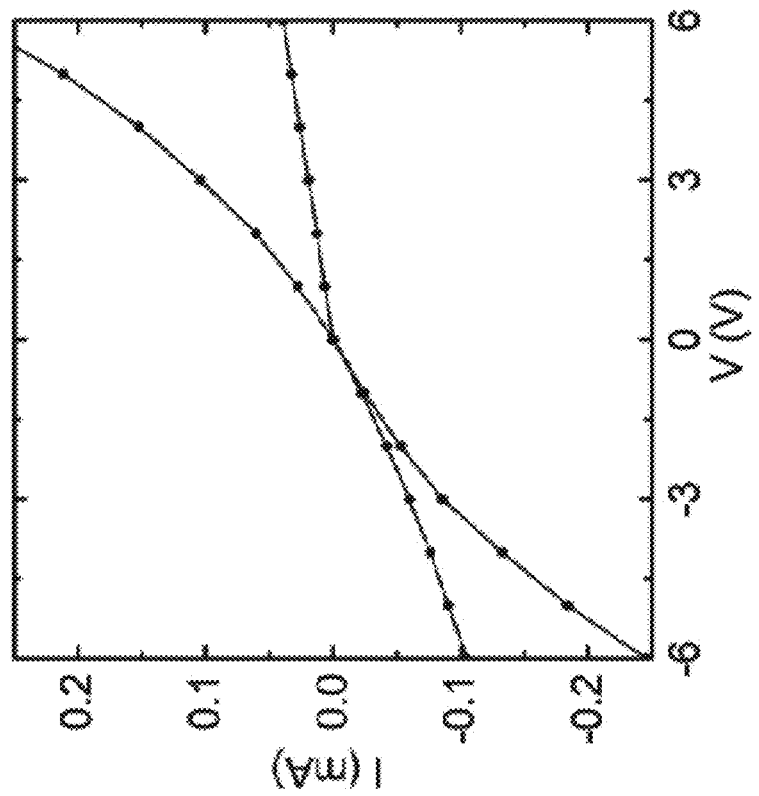
Figure 9D:
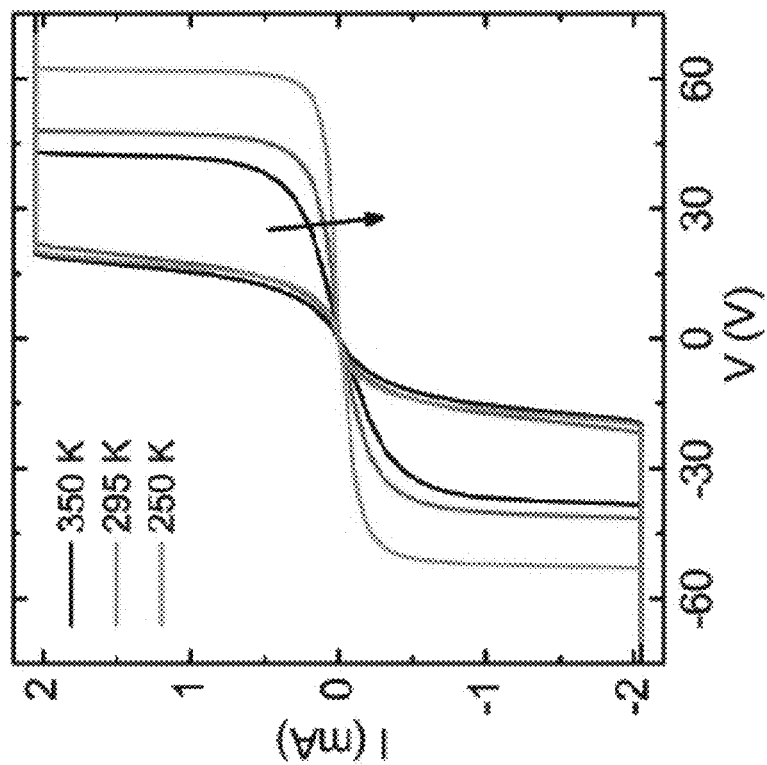
Figure 9C:
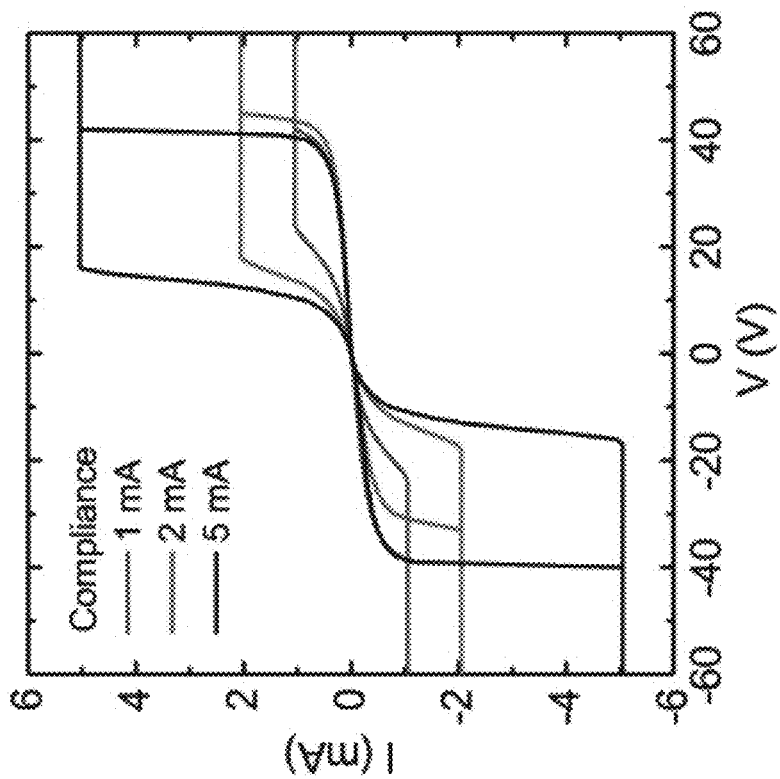

FIG. 1F shows typical current-voltage (I-V) characteristics of a 2 μm thick lateral $MoS_2$ memristor. In sweep '1', the device begins in a high resistance state 1 (HRS1) and switches to a low resistance state (LRS) at a voltage $V_{ON}$ where current is limited by the instrument compliance ($I_{COMP}$). Decreasing the voltage from the maximum voltage ($V_{MAX}$) in sweep '2' switches the devices back to another high resistance state 2 (HRS2) at a voltage $V_{OFF}$. Nearly symmetric switching behavior occurs in the negative bias sweeps '3' and '4'. The resistance ratio HRS1/HRS2 at zero bias is found to be in the range of about 2-5, whereas the highest value of the HRS1/LRS switching ratio (at $V_{OFF}$) exceeds 100, as shown in FIGS. 9A-9B. One could envision the hysteretic loop to be an artifact of the current compliance if the power dissipation at the critical points of switching ON and OFF are comparable. However, power dissipation just before switching ON (e.g., $V_T \times I_T = 10.1$ mW shown in FIG. 1F) and switching OFF ($V_{OFF} \times I_{COMP} = 35.7$ mW) differs by 2-5 times for more than 50 measured devices. Moreover, the switching behavior remains qualitatively similar for different $I_{COMP}$ values, as shown in FIG. 9C. Interestingly, the ratio of power dissipation at $V_{ON}$ and $V_{OFF}$ correlates well with the HRS1/HRS2 ratio at zero bias, which suggests that the internal resistance of the $MoS_2$ memristor has changed during switching [21]. As discussed below, the device acts as a non-linear dynamical system including a memristor and a thermistor with a thermal runaway process.

The I-V characteristics are fit with a thermal runaway model, $$I = V/R + C \cdot \exp(V^{(V \cdot D)^m} + D),$$

where R, C, m and D are fitting parameters, as shown in FIG. 1G. The first term accounts for ohmic conduction through the non-filamentary part of the channel, and the second term captures positive feedback between current and power dissipated by Joule heating. Indeed, variable temperature (T) measurements show a negative temperature coefficient of resistance that is critical for positive feedback in a thermal runaway process, as shown in FIG. 9D. $V_{ON}$ also increases with decreasing T, which is consistent with a larger power being required to achieve thermal runaway at lower T due to the increased thermal gradient (and thermal conduction) from the thermal hot-spot to the adjacent media. The switching field ($E_{avg} = V_{ON}/L < 5$ kV $cm^{-1}$) is significantly smaller than both conventional $TiO_x/TiO_2$ crossbar memristors (>0.2 MV $cm^{-1}$) [23] and vertical memristors from monolayer 2D materials including $MoS_2$ (>10 MV $cm^{-1}$) [12]. Instead, the switching field approaches that of vertical memristors from solution-processed $MoO_x/MoS_2$ and $WO_x/WS_2$ films (about 10 kV $cm^{-1}$) [7], where switching is electroforming-free in both cases. While defect migration in amorphous materials is the basis of most conventional filamentary and interfacial resistive switching, it is unlikely for defects or atoms to migrate across the van der Waals gap between nanoflakes in composite films. Instead, resistive switching appears to occur by thermally activated electrical discharge triggered by large local fields ($E_{max}$) concentrated between nanoflakes of small radii of curvature, $$E_{max} = \frac{2E_{avg} \cdot w}{R \cdot \log(1 + 4w/R)},$$

where w is gap between nanoflakes, and R is the radius of curvature (FIG. 1G inset) [24]. For example, R≈1 nm and w≈20 nm yields $$E_{max} \approx \frac{E_{avg} \cdot w}{R} \approx 0.2 \ MV \ cm^{-1},$$

which approaches the breakdown field of 0.25 MV $cm^{-1}$ under vacuum conditions of $10^{-5}$ Torr [22].

Figure 2B:
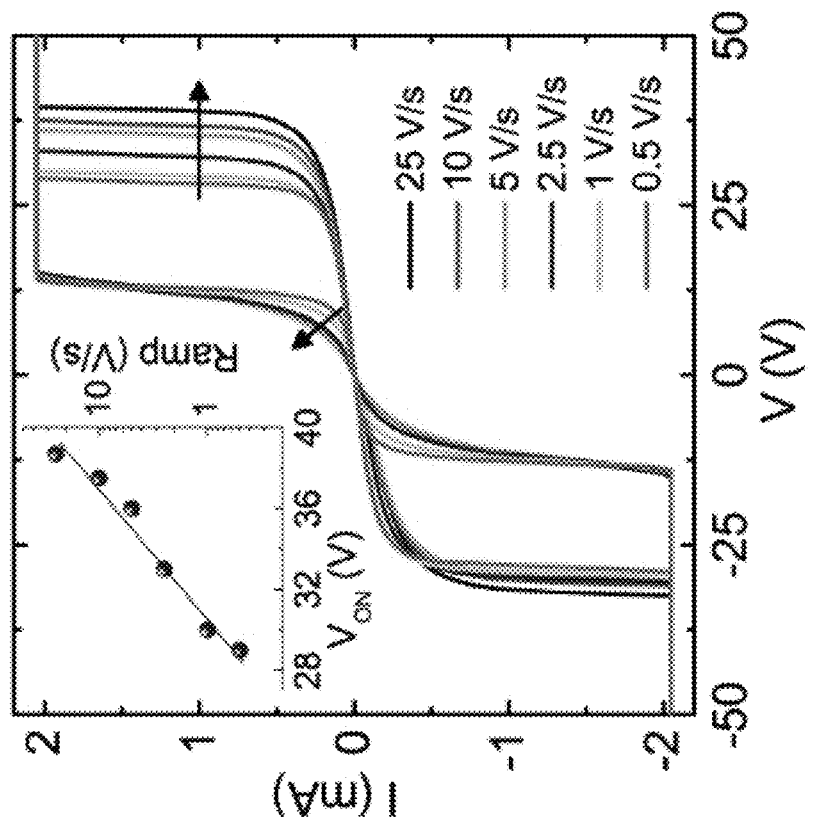
FIGS. 2A-2F illustrate charge transport and switching behaviors of solution-processed MoS$_2$ memristors, according to certain embodiments of the invention.
Figure 2A:
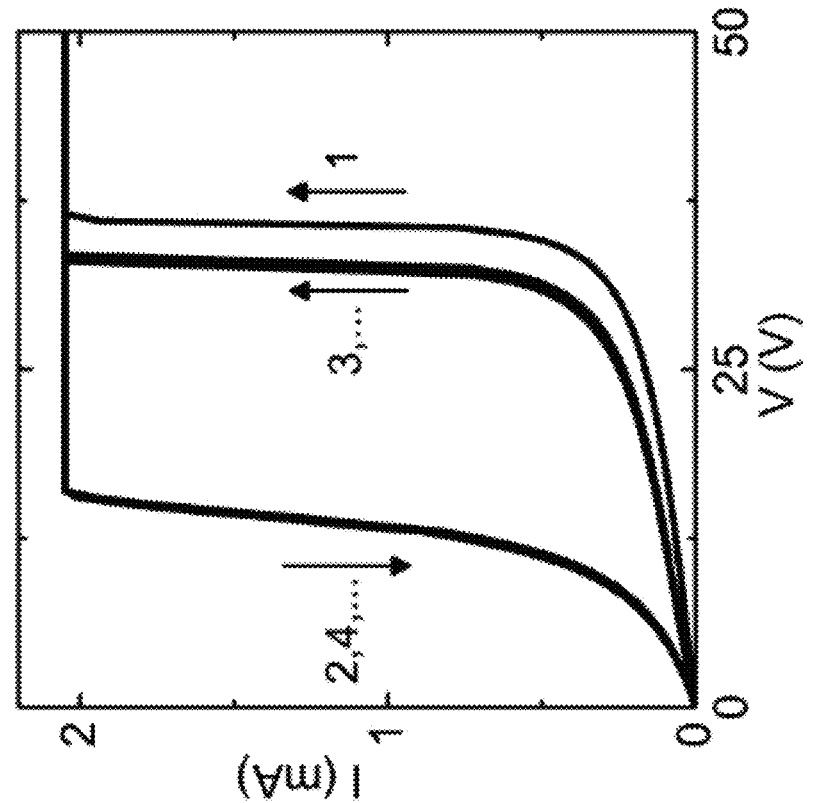
Figure 2D:
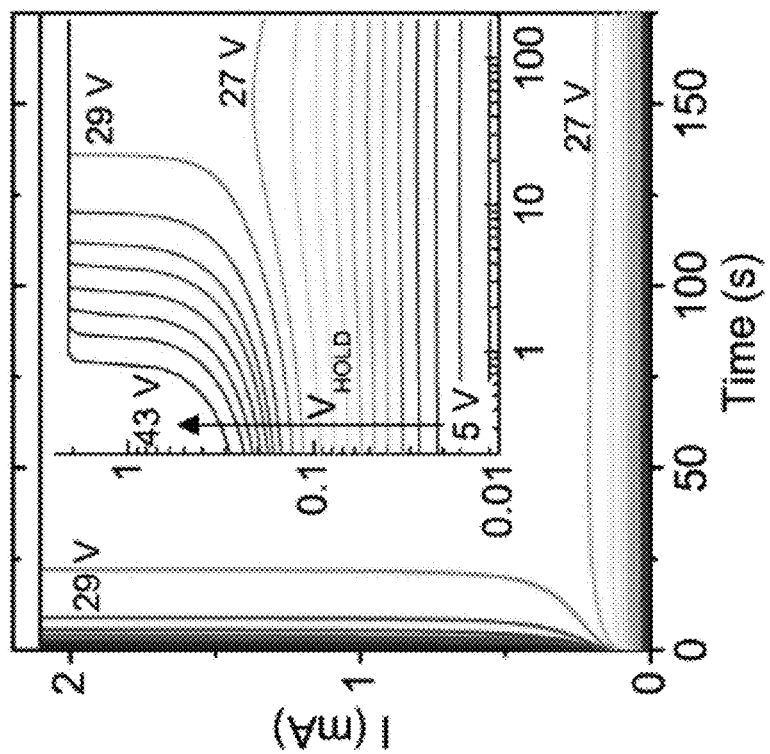
Figure 2C:
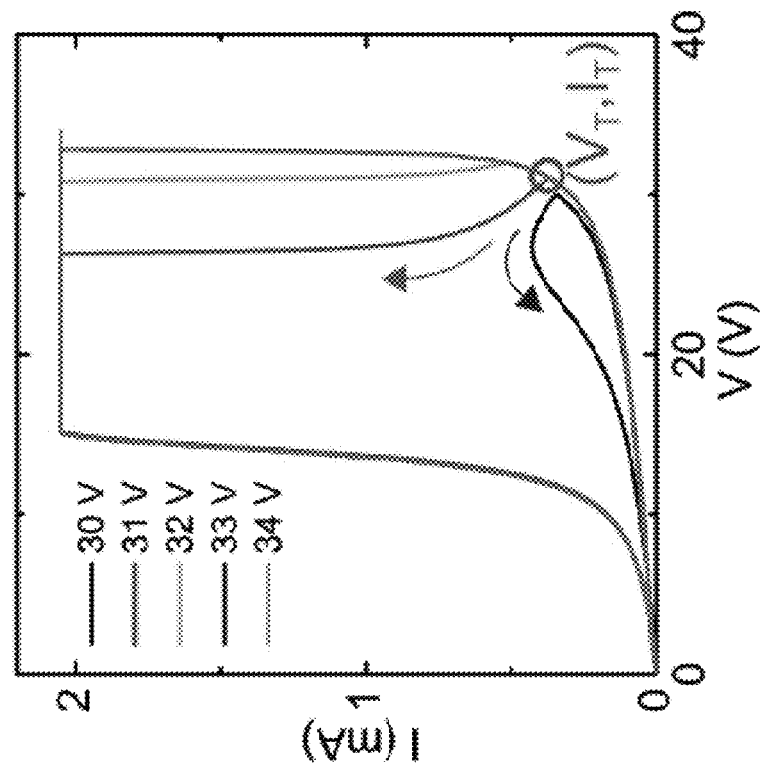
Figure 9F:
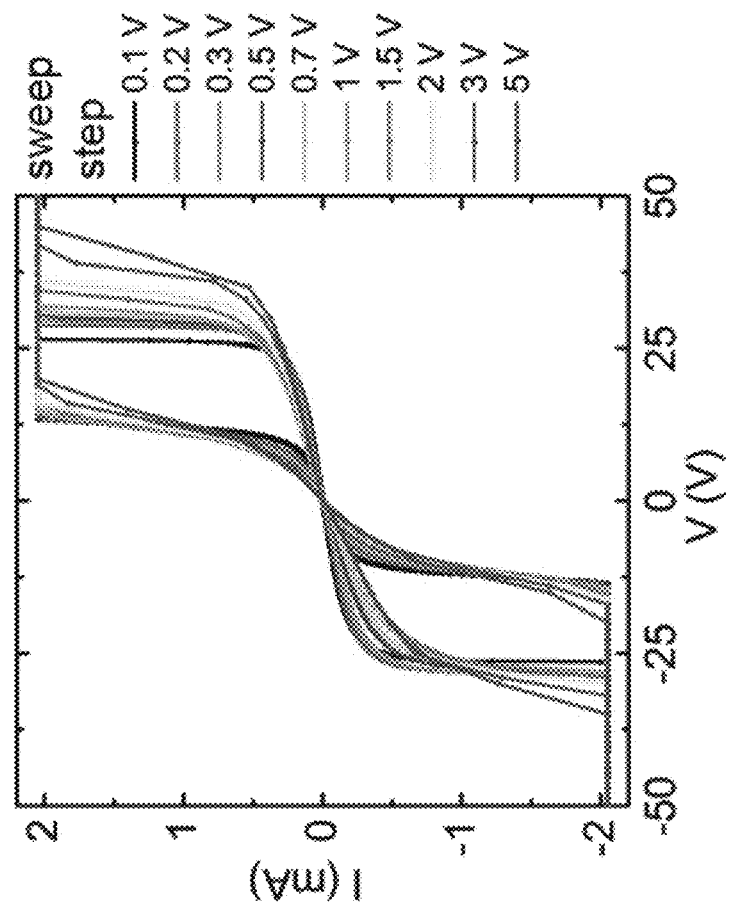
Figure 9E:
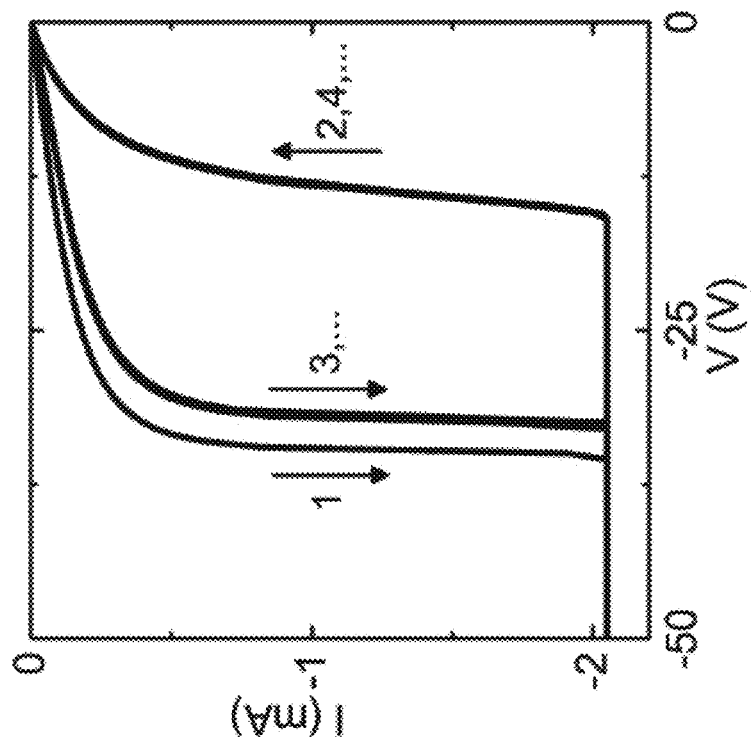
Figures 10A, 10B:
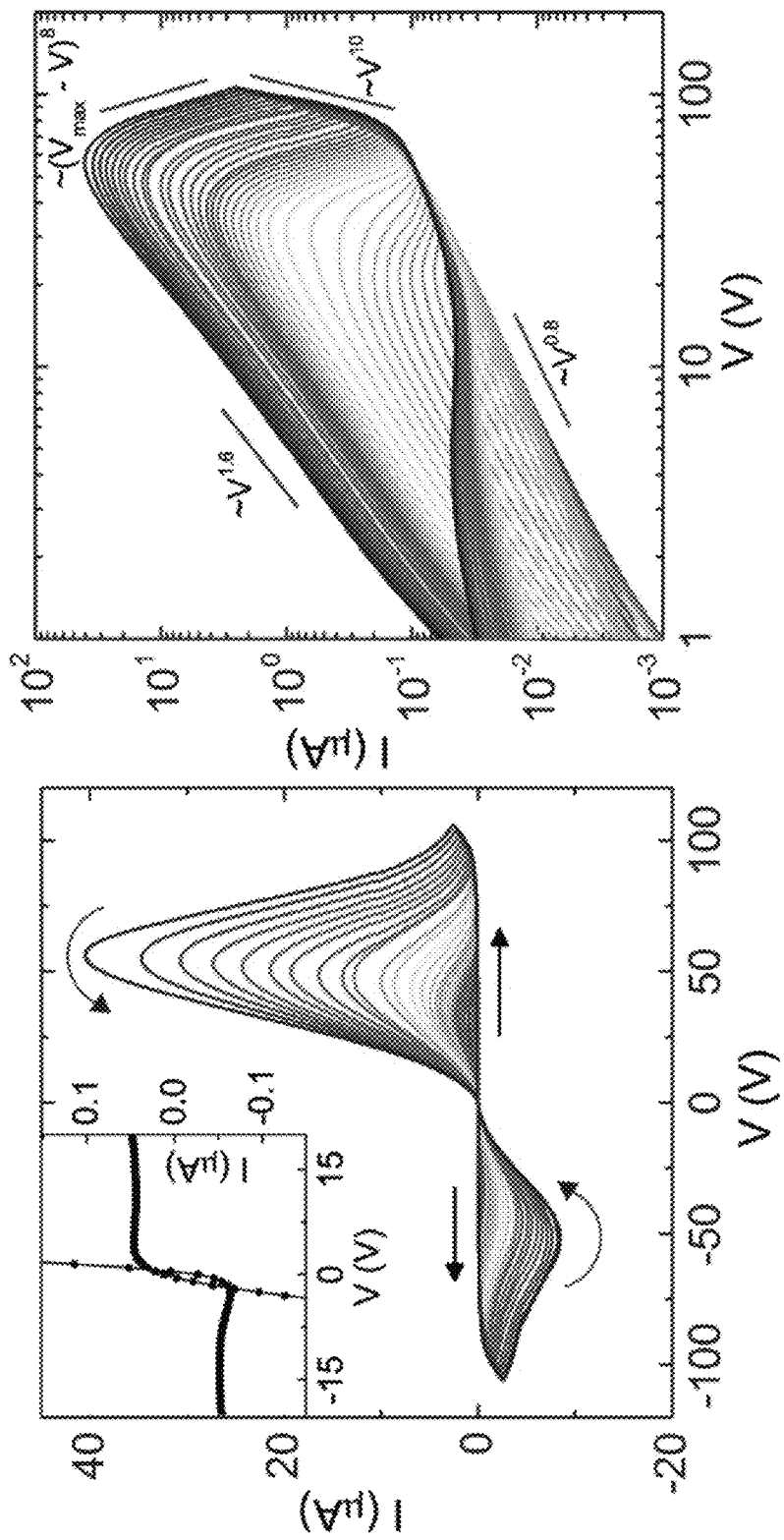
FIGS. 10A-10D show characteristics of about 0.5 μm thick soft thermistor memristors, according to certain embodiments of the invention.
Figure 10D:
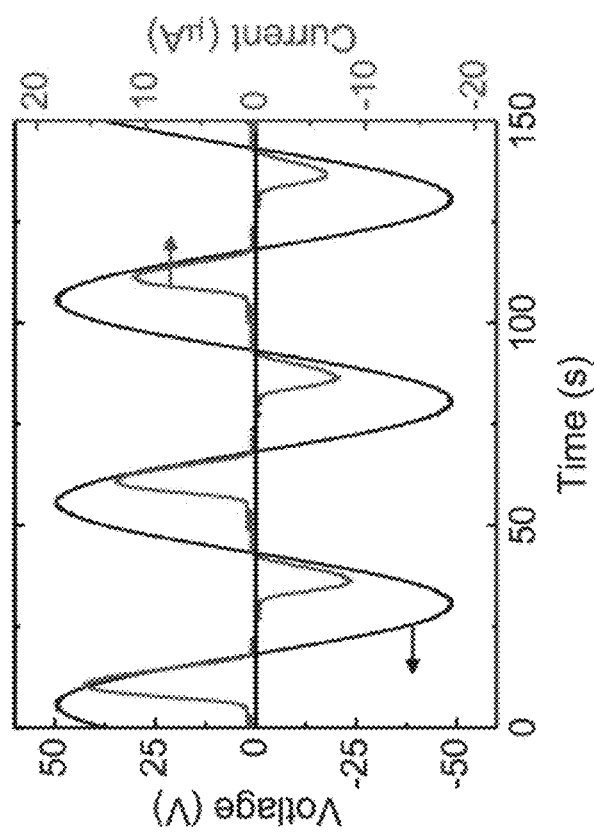
Figure 10C:
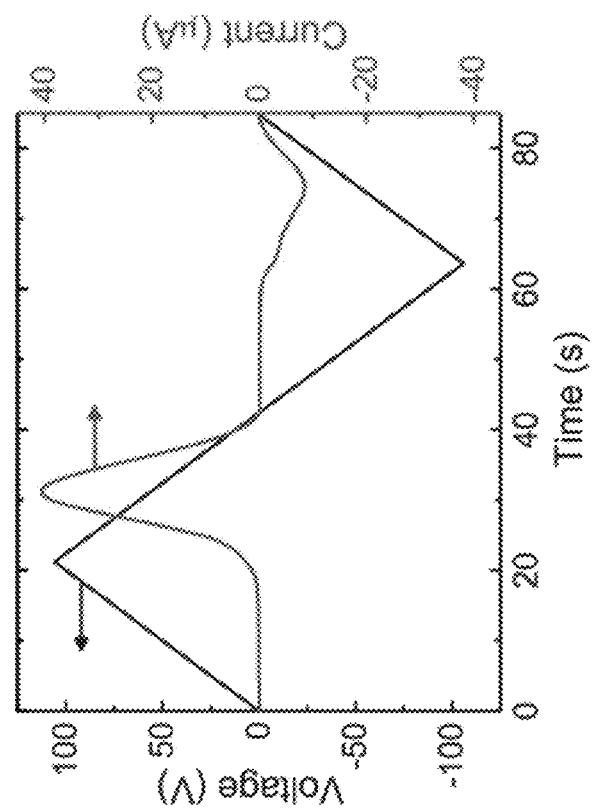

Joule heating and thermophoresis are phenomena often associated with unipolar switching since bias sweeps of opposite polarities are not needed to switch the device back and forth [25,26]. Indeed, the lateral memristors show a volatile memristive loop for unipolar sweeps in both positive and negative directions, as respectively shown in FIGS. 2A and 9E. In addition, I-V curves for sweep '1' and sweep '3' do not overlap, while all subsequent sweeps (e.g., sweep '3', sweep '5', etc.) do overlap. This behavior suggests a non-volatile bipolar resistive switching component that is accentuated in vertical memristors [7]. Increasing the bias ramp rate from about 0.5 to 25 V s$^{-1}$ increases $V_{ON}$ from about 29 to 38.7 V logarithmically meaning a larger field is needed to reach a critical temperature at a faster ramp rate, as shown in FIGS. 2B and 9F. Furthermore, the current in HRS2 increased by about 10× at a bias ramp rate of about 25 V s$^{-1}$ due to insufficient time for heat to dissipate in sweep '2'. Varying the sweep bias range ($V_{MAX}$) in the vicinity of $V_T$ reveals the role of temperature as an internal state variable. For $V_{MAX}<V_T$, the current continues to increase at decreasing voltage showing dynamic negative differential resistance (NDR), but the current does not reach $I_{COMP}$, as shown in FIG. 2C. At $V_{MAX}=V_T$, the current shows enhanced NDR behavior and reaches $I_{COMP}$, while for $V_{MAX}>V_T$, the characteristics begin to resemble standard behavior. Thus, $V_T$ is a point-of-no-return at which the device has reached a critical local temperature for thermal runaway. The characteristic time for switching is revealed by holding the device at a fixed bias ($V_{HOLD}$) and measuring the current versus time, as shown in FIG. 2D. For $V_{HOLD}<V_T$, the current first increases to a maximum value and then decreases to a steady-state value asymptotically (27 V<$V_T$<29 V, as shown in FIG. 2D). For $V_{HOLD} \geq V_T$, the current reaches $I_{COMP}$ at a time torr that decreases exponentially from the maximum value of about 20 sec at $V_T$ with increasing $V_{HOLD}$, as shown in FIG. 2E. The exponential trends shown in the inset of FIG. 2B (ramp≈exp($V_{ON}$)) and in FIG. 2E ($t_{ON}$≈exp($-V_{HOLD}$)) further corroborate the thermal runaway process.

A deeper understanding of the switching mechanism is gained by studying the film thickness (d) dependence and by performing in-situ optical, chemical, and thermal measurements. Three different kinds of switching behavior are observed depending on thickness. First, as discussed in FIGS. 1A-1G and 2A-2F, the devices with d≈1-2 μm show thermally-assisted hard switching with an experimentally unreachable I-V phase space (i.e., between the curves for $V_{MAX}$=30 and 31 V shown in FIG. 2C) that is similar to a bistable loop in NbO$_2$ Mott memristors [2] and can be described as hard thermistor memristors. Second, the devices with d<500 nm show I-V characteristics with a dynamic NDR feature similar to that for $V_{MAX}<V_T$ in FIG. 2C, except that the current never reaches $I_{COMP}$ even for $V_{MAX}$=100 V, as shown in FIGS. 10A-10D. These devices show a volatile switching ratio of about 10$^3$ with ohmic characteristics at low biases and non-linear soft switching (I≈V$^{10}$) at high biases. The entire phase space between curves is experimentally reachable in this case, with these devices acting as soft thermistor memristors. Third, the devices with d≥4 μm show an irreversible change in conduction by about 10$^4$-fold, which resembles write-once-read-many (WORM) memory, as shown in FIG. 3A.

Figure 2F:
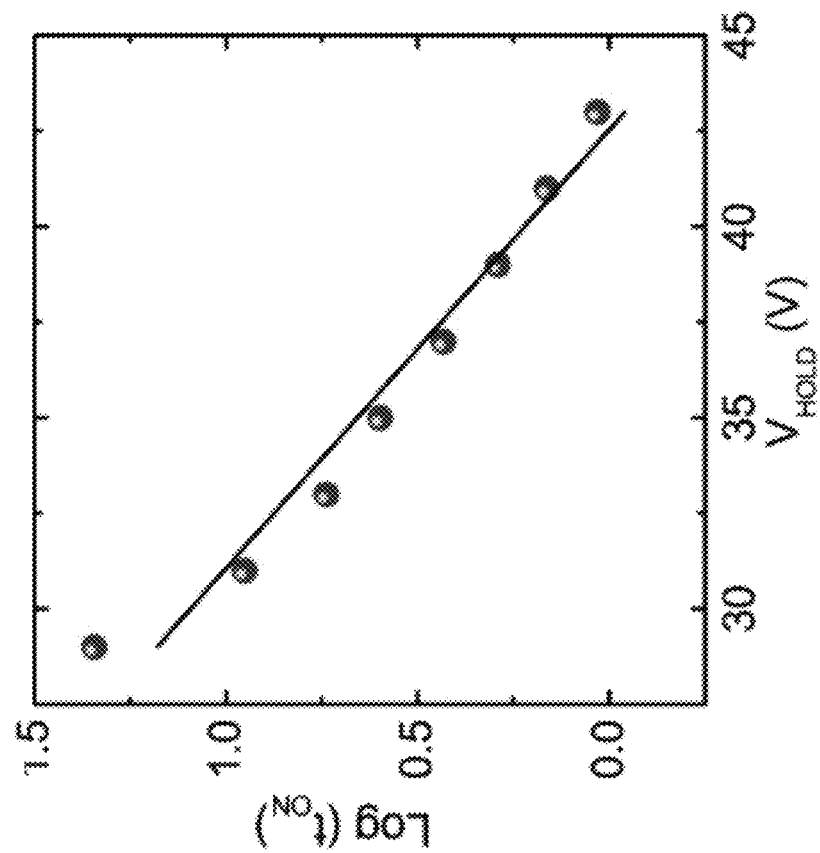
Figure 2E:
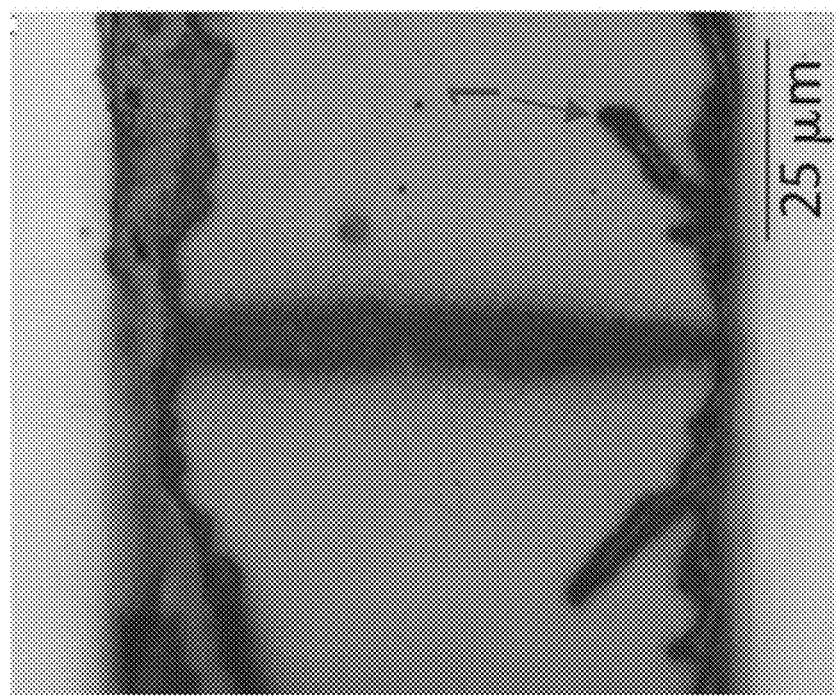
Figure 3D:
Figure 3F:
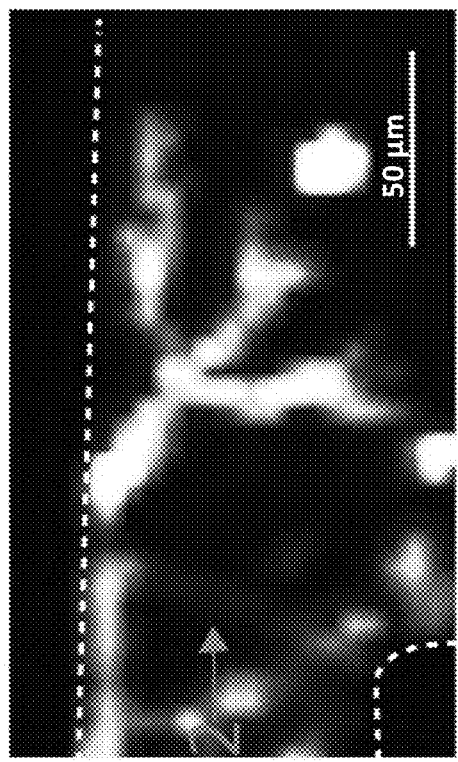
Figure 3E:
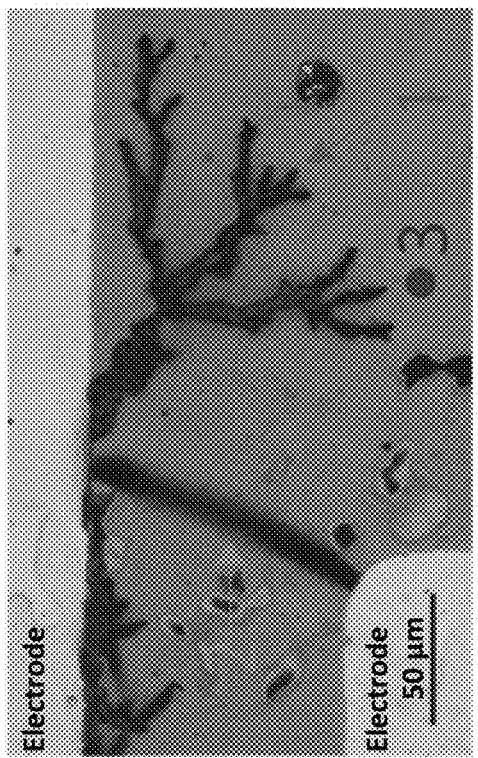
Figure 3G:
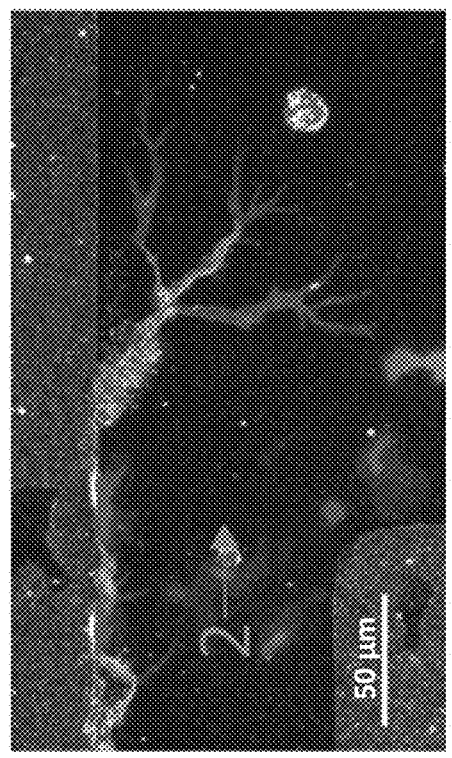
Figure 11B:
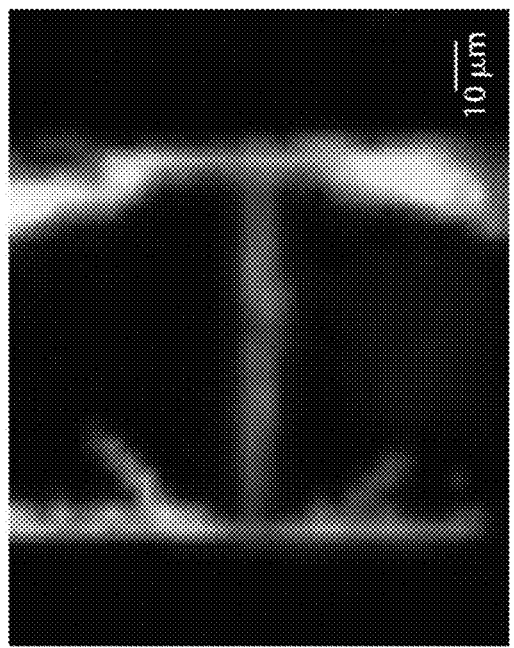
FIGS. 11A-11E show photoluminescence and atomic force microscopy of filaments, according to certain embodiments of the invention.
Figure 11D:
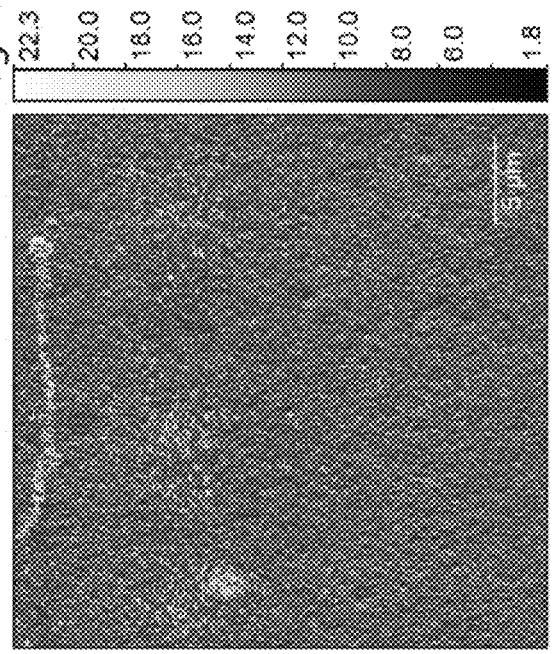
Figure 11A:
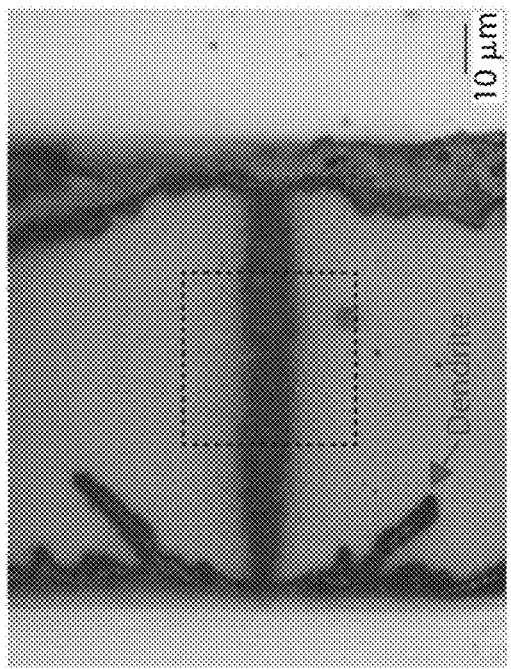
Figure 11C:
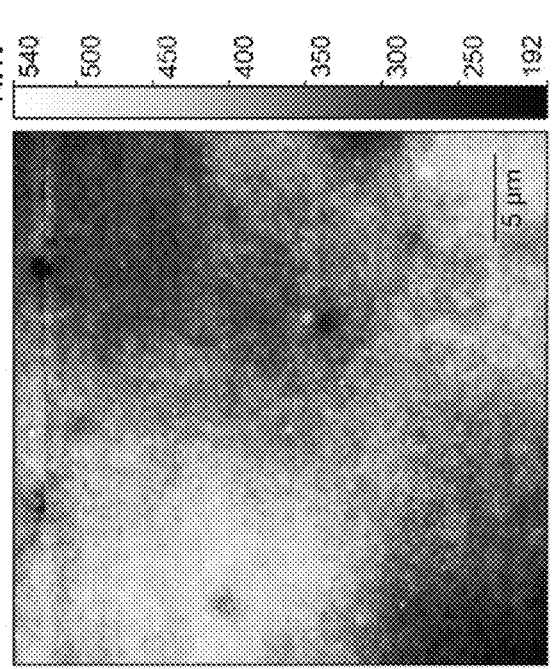
Figure 11E:
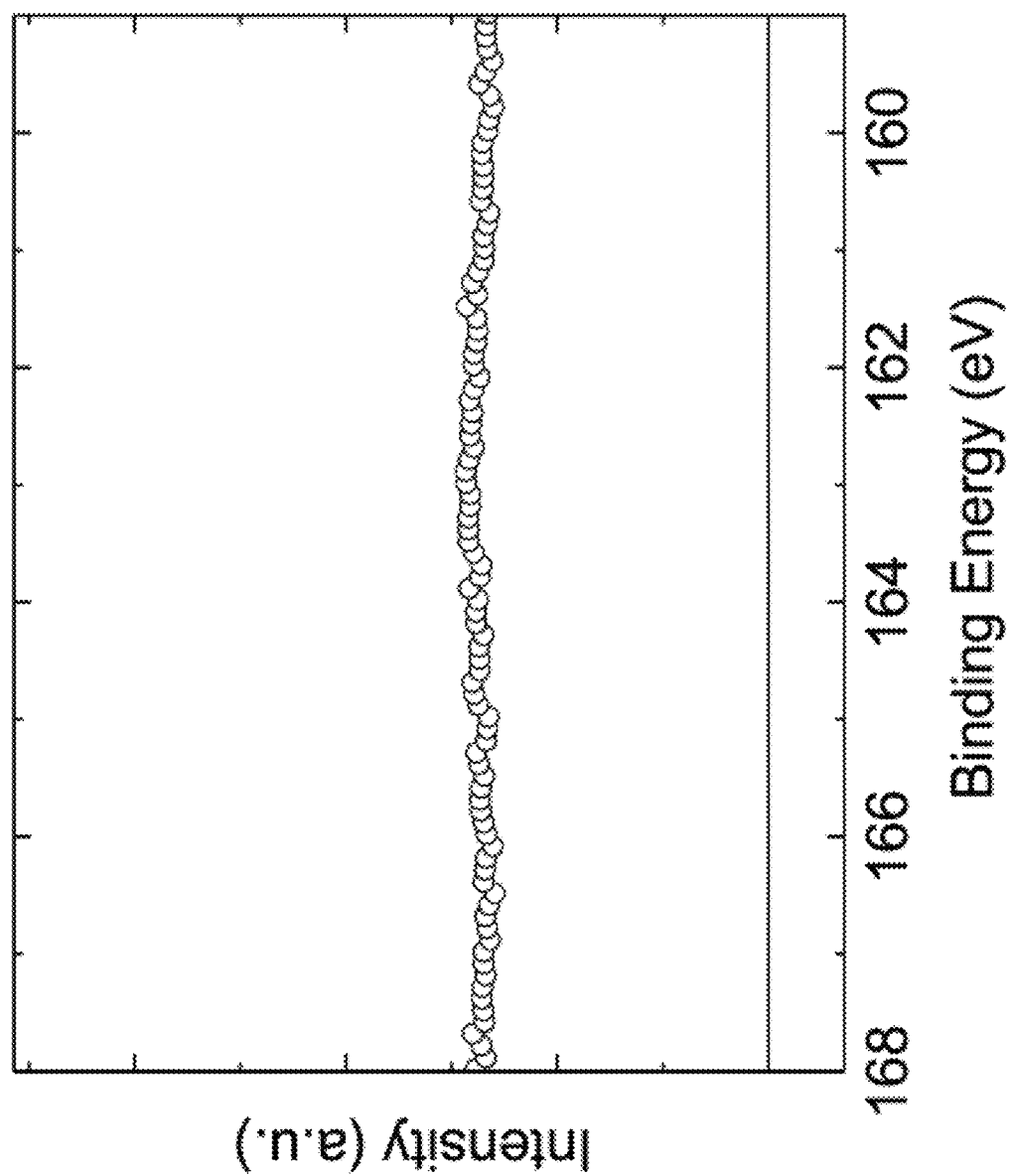

Optical microscopy of the MoS$_2$ memristors after electrical measurements reveals two types of black features in the channel—filaments and dendrites, as shown in FIG. 2F. Filaments are only observed in hard thermistor memristors and always bridge the two electrodes. Filaments show no topography in atomic force microscopy (AFM) and are buried in the film, as shown in FIGS. 11C-11D. Dendrites are found bridging the two electrodes only in WORM devices and protrude from the channel surface by hundreds of nanometers. Some hard thermistor memristors, for example in FIG. 2F, also show dendrites, but they are always near the electrode edges without bridging them. None of the soft thermistor memristors showed any visible features. It should be noted that hard thermistor memristors can be converted into WORM devices by either annealing at a temperature higher than 250° C. or by setting $I_{COMP}$ larger than 10 mA. An in-situ optical video reveals that dendrite formation in WORM devices is accompanied by a strong flash of blue light emission for the duration of about 200 ms at $V_{ON}$, as shown in lower inset of FIG. 3A. Burning of sulfur powder in ambient conditions (i.e., oxidizing environment) also emanates blue flames. Consistent with an oxidation process, XPS of the dendrites reveals a strong signal for Mo$^{6+}$ (MoO$_3$) and no measurable signal for Mo$^{4+}$ (MoS$_2$) or S$^{2-}$, as shown in FIGS. 3B and 11E. PL also shows a peak that has been correlated with MoO$_x$ that is stronger for dendrites than filaments, as shown in FIG. 3C. In addition, dark-field optical microscopy shows contrast for dendrites but not filaments, which corroborates the AFM results that filaments are sub-surface, as shown in FIGS. 3D-3E. Time-of-flight secondary ion mass spectrometry (ToF-SIMS) and PL maps further confirm the deficiency of sulfur in filaments and dendrites, as shown in FIGS. 3F-3G and 12A-12F.

Figure 4A:
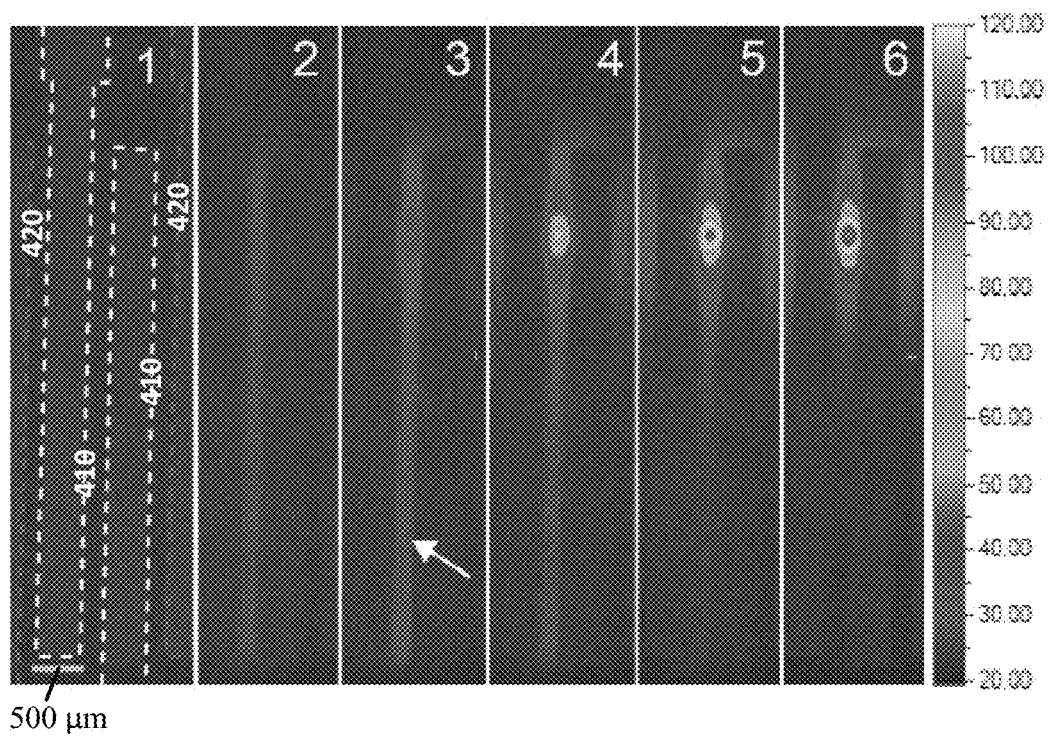
FIGS. 4A-4F shows in-situ thermal imaging and current-voltage characteristics of solution-processed MoS$_2$ memristors, according to certain embodiments of the invention.
Figure 4B:
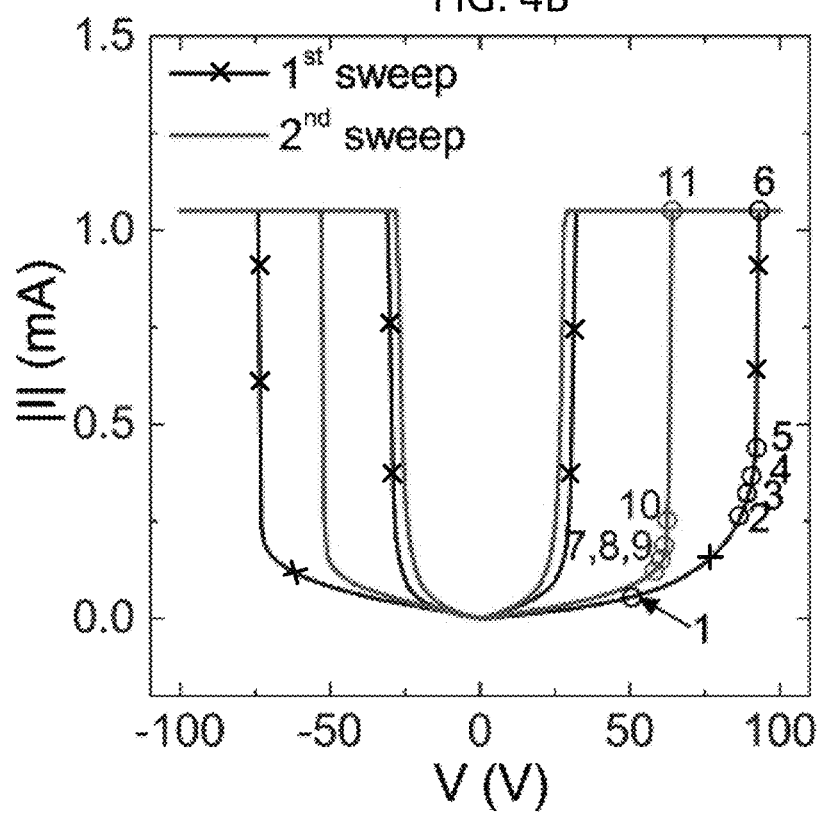
Figure 4C:
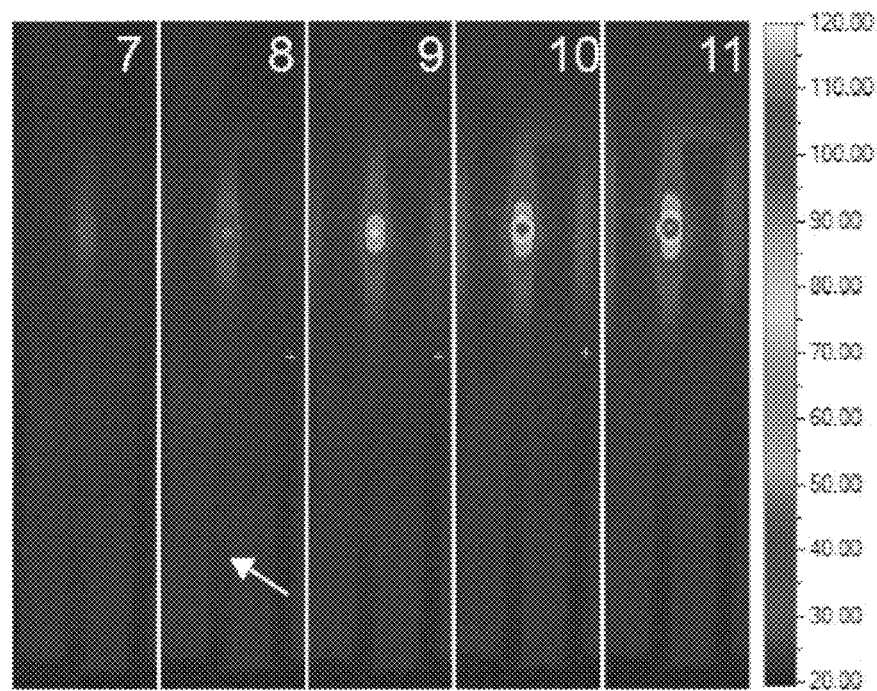
Figure 4D:
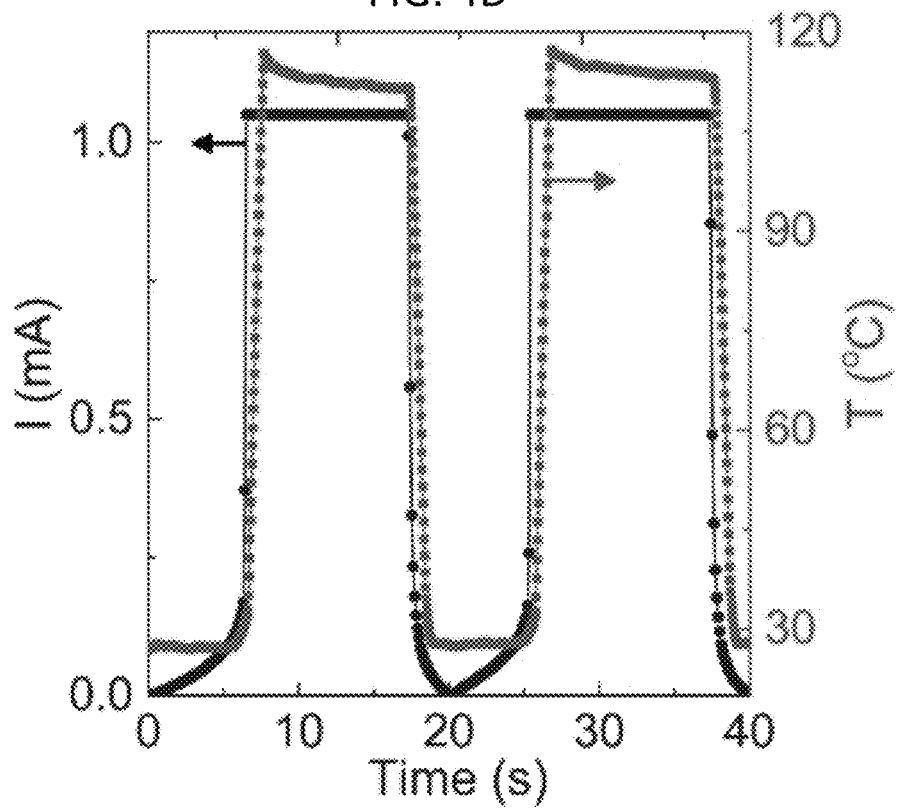
Figure 4E:
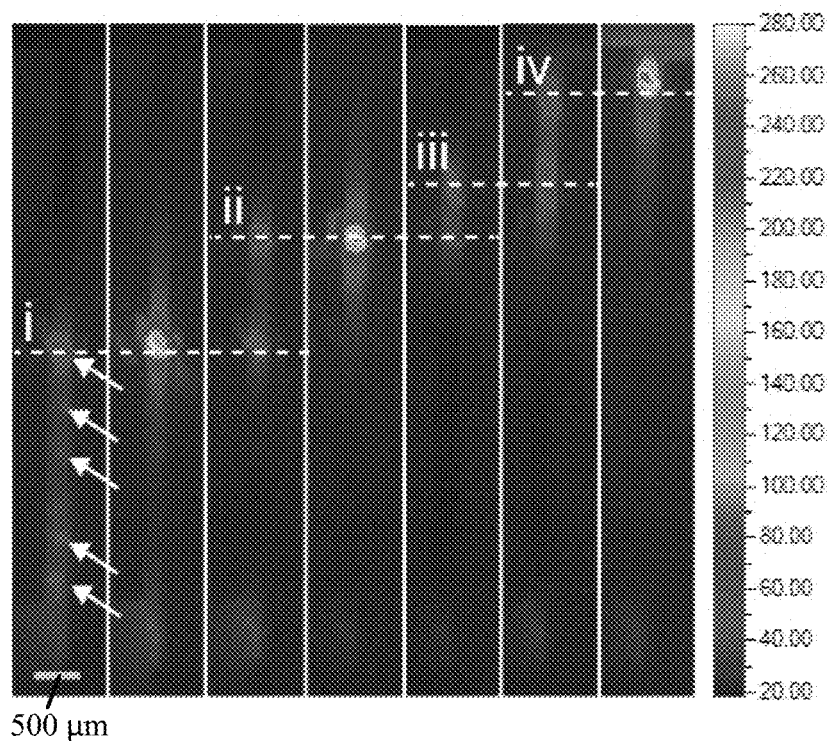
Figure 4F:
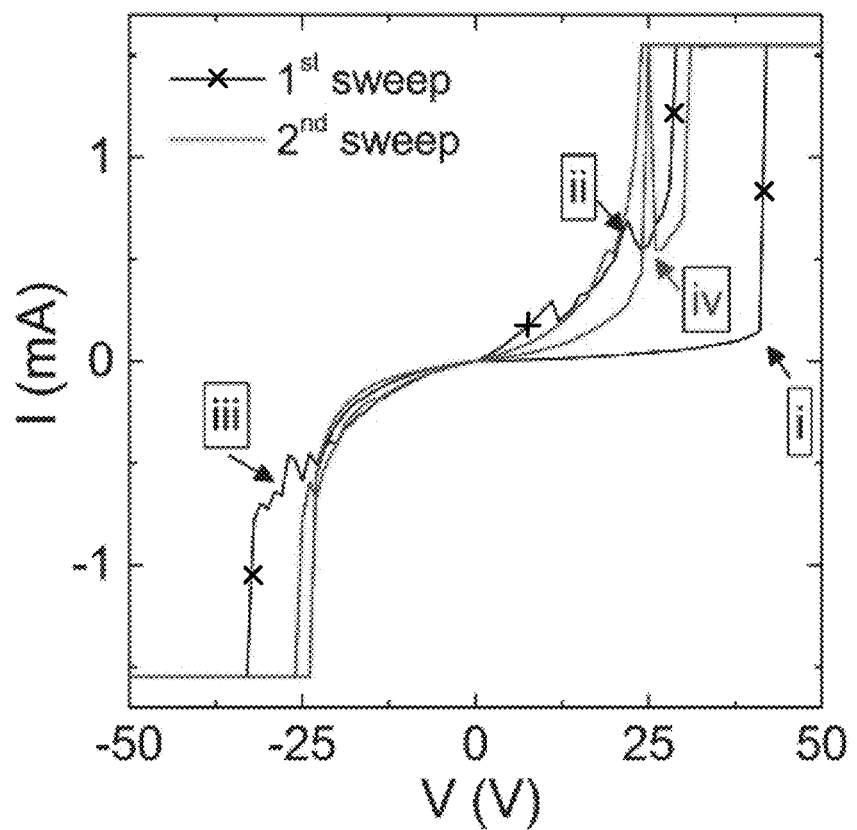

Finally, direct evidence of thermally-assisted switching is obtained by in-situ infrared imaging of MoS$_2$ memristors, as shown in FIGS. 4A-4F. The first bias sweep in a hard thermistor memristor shows the whole channel heating up to 36° C. at low biases. Then, as the bias approaches $V_{ON}$, a spatially localized region begins to heat faster (i.e., hot-spot) while the rest of the channel cools down to the temperature of the thermal bath (20° C.). The hot-spot ultimately reaches a maximum temperature of about 116° C. and develops into a filament, as shown in FIGS. 4A-4B. In the subsequent bias sweep, the non-filamentary region does not increase in temperature before the fully-developed filament begins to heat up, as shown in FIGS. 4C-4D. Since the temperature measurement is limited by the imaging pixel size of 5 μm, sub-micron local temperatures are likely to exceed the measured values. Nevertheless, minor differences in overall channel conductivity near $V_{ON}$ during the first and second measurement explain the apparent absence of an electroforming feature in the I-V characteristics. In-situ infrared imaging of a soft thermistor memristor reveals that channel temperatures increase to about 30-40° C. without forming a hot-spot. In contrast, in-situ infrared imaging of WORM devices shows dynamic competition between multiple filaments until a winner-takes-all filament heats up to about 240-270° C., which approaches or exceeds the original annealing temperature, and results in uncontrollable thermal runaway and dendrite formation, most likely by fractal discharge, as shown in FIGS. 4E-4F [28]. Discontinuous steps in the I-V characteristics correspond to the redistribution of heat (and current) among competing dendrites.

The observed switching behavior is generalizable to other 2D semiconductors such as WS$_2$, ReS$_2$, and InSe, as shown in FIGS. 13A-13C, using a variety of solution processing conditions including aqueous dispersions using non-ionic Pluronic surfactants or ionic sodium cholate surfactants in addition to surfactant-free ethanol-water co-solvent systems [14, 15, 29]. The independence of the observed switching on the material or processing details is consistent with the mechanism of thermal runaway caused by an electrical discharge that only depends on nanoflake morphology. Thus, these devices not only achieve ultralow switching fields (few kV cm$^{-1}$) but also behave as second-order memristors with a state variable (temperature) other than current and voltage. The thermally activated electrical discharge mechanism in solution-processed 2D semiconductor films is fundamentally different from defect migration in conventional metal-oxide memristors [4,30], which likely has relevance for related devices based on 2D semiconductor films including photodetectors, field-effect transistors, and non-volatile memory [7, 11, 13, 17, 19]. The non-linear positive feedback at $V_{ON}$ could also be used to amplify thermal noise for random number generators and embodies the essential characteristics for chaotic circuits, neuristors, and related neuromophic computing devices [1].

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Crane, H. D. The neuristor. *IRE Trans. on Elect. Computers* EC-9, 370-371 (1960).

[2]. Kumar, S., Strachan, J. P. & Williams, R. S. Chaotic dynamics in nanoscale $NbO_2$ Mott memristors for analogue computing. *Nature* 548, 318-321 (2017).

[3]. Pickett, M. D., Medeiros-Ribeiro, G. & Williams, R. S. A scalable neuristor built with Mott memristors. *Nat. Mater.* 12, 114-117 (2013).

[4]. Kim, S., et al. Experimental demonstration of a second-order memristor and its ability to biorealistically implement synaptic plasticity. *Nano Lett.* 15, 2203-2211 (2015).

[5]. Leon, C. Memristor, Hodgkin-Huxley, and edge of chaos. *Nanotechnology* 24, 383001 (2013).

[6]. Yang, J. J., Strukov, D. B. & Stewart, D. R. Memristive devices for computing. *Nat. Nanotechnol.* 8, 13-24 (2013).

[7]. Bessonov, A. A., et al. Layered memristive and memcapacitive switches for printable electronics. *Nat. Mater.* 14, 199-204 (2015).

[8]. Sangwan, V. K., et al. Gate-tunable memristive phenomena mediated by grain boundaries in single-layer $MoS_2$. *Nat. Nanotechnol.* 10, 403-406 (2015).

[9]. Sangwan, V. K., et al. Multi-terminal memtransistors from polycrystalline monolayer molybdenum disulfide. *Nature* 554, 500-504 (2018).

[10]. Chen, M., et al. Multibit data storage states formed in plasma-treated $MoS_2$ transistors. *ACS Nano* 8, 4023-4032 (2014).

[11]. Son, D., et al. Colloidal synthesis of uniform-sized molybdenum disulfide nanosheets for wafer-scale flexible nonvolatile memory. *Adv. Mater.* 28, 9326-9332 (2016).

[12]. Ge, R., et al. Atomristor: Nonvolatile resistance switching in atomic sheets of transition metal dichalcogenides. *Nano Lett.* 18, 434-441 (2018).

[13]. Tan, C., Liu, Z., Huang, W. & Zhang, H. Non-volatile resistive memory devices based on solution-processed ultrathin two-dimensional nanomaterials. *Chem. Soc. Rev.* 44, 2615-2628 (2015).

[14]. Kang, J., Sangwan, V. K., Wood, J. D. & Hersam, M. C. Solution-based processing of monodisperse two-dimensional nanomaterials. *Acc. Chem. Res.* 50, 943-951 (2017).

[15]. Kang, J., et al. Thickness sorting of two-dimensional transition metal dichalcogenides via copolymer-assisted density gradient ultracentrifugation. *Nat. Commun.* 5, 5478 (2014).

[16]. Title, R. S. & Shafer, M. W. Band structure of the layered transition-metal dichalcogenides: An experimental study by electron paramagnetic resonance on Nb-doped $MoS_2$. *Phys. Rev. Lett.* 28, 808-810 (1972).

[17]. Yu, X., Prévot, M. S. & Sivula, K. Multiflake thin film electronic devices of solution processed 2D $MoS_2$ enabled by sonopolymer assisted exfoliation and surface modification. *Chem. Mater.* 26, 5892-5899 (2014).

[18]. Cunningham, G., et al. Photoconductivity of solution-processed $MoS_2$ films. *J. Mater. Chem. C* 1, 6899-6904 (2013).

[19]. Kelly, A. G., et al. All-printed thin-film transistors from networks of liquid-exfoliated nanosheets. *Science* 356, 69-73 (2017).

[20]. Benoist, L., et al. X-ray photoelectron spectroscopy characterization of amorphous molybdenum oxysulfide thin films. *Thin Solid Films* 258, 110-114 (1995).

[21]. Chua, L. Resistance switching memories are memristors. *Appl. Phys. A* 102, 765-783 (2011).

[22]. Kuchler, A. *High Voltage Engineering.* Springer Nature, 2018.

[23]. Yang, J. J., et al. Memristive switching mechanism for metal/oxide/metal nanodevices. *Nat. Nanotechnol.* 3, 429-433 (2008).

[24]. Mason, J. H. Discharges. *IEEE Trans. on Elect. Insulation* EI-13, 211-238 (1978).

[25]. Chang, S., et al. Occurrence of both unipolar memory and threshold resistance switching in a NiO film. *Phys. Rev. Lett.* 102, 026801 (2009).

[26]. Strukov, D. B., Alibart, F. & Stanley Williams, R. Thermophoresis/diffusion as a plausible mechanism for unipolar resistive switching in metal-oxide-metal memristors. *Appl. Phys. A* 107, 509-518 (2012).

[27]. Oh, H. M., et al. Photochemical reaction in monolayer $MoS_2$ via correlated photoluminescence, Raman spectroscopy, and atomic force microscopy. *ACS Nano* 10, 5230-5236 (2016).

[28]. Niemeyer, L., Pietronero, L. & Wiesmann, H. J. Fractal dimension of dielectric breakdown. *Phys. Rev. Lett.* 52, 1033-1036 (1984).

[29]. Kang, J., et al. Layer-by-layer sorting of rhenium disulfide via high-density isopycnic density gradient ultracentrifugation. *Nano Lett.* 16, 7216-7223 (2016).

[30]. Abdelouahab, M.-S., Lozi, R. & Chua, L. Memfractance: A mathematical paradigm for circuit elements with memory. *Inter. J. of Bifur. and Chaos* 24, 1430023 (2014).

[31]. Kang, J., et al. Solvent exfoliation of electronic-grade, two-dimensional black phosphorus. *ACS Nano* 9, 3596-3604 (2015).

[32]. Kang, J., et al. Stable aqueous dispersions of optically and electronically active phosphorene. *Proc. Natl. Acad. Sci. U.S.A* 113, 11688-11693 (2016).

[33]. Eda, G., et al. Photoluminescence from chemically exfoliated $MoS_2$. *Nano Lett.* 11, 5111-5116 (2011).

[34]. Kim, I. S., et al. Influence of stoichiometry on the optical and electrical properties of chemical vapor deposition derived $MoS_2$. *ACS Nano* 8, 10551-10558 (2014).

[35]. Benoist, L., et al. X-ray photoelectron spectroscopy characterization of amorphous molybdenum oxysulfide thin films. *Thin Solid Films* 258, 110-114 (1995).

[36]. Baker, M. A., Gilmore, R., Lenardi, C. & Gissler, W. XPS investigation of preferential sputtering of S from $MoS_2$ and determination of $MoS_x$ stoichiometry from Mo and S peak positions. *Appl. Surf Sci.* 150, 255-262 (1999).

[37]. Lee, C., et al. Anomalous lattice vibrations of single- and few-layer $MoS_2$. *ACS Nano* 4, 2695-2700 (2010).

[38]. Kang, J., et al. Layer-by-layer sorting of rhenium disulfide via high-density isopycnic density gradient ultracentrifugation. *Nano Lett.* 16, 7216-7223 (2016).

What is claimed is:

1. A memristor, comprising:
a semiconductor film formed on a nanoporous membrane; and
at least two electrodes spatial-apart formed on the semiconductor film and electrically coupled with the semiconductor film to define a channel in the semiconductor film between the at least two electrodes, wherein the channel has one or more filaments, one or more dendrite, or a combination of them formed in the semiconductor film,
wherein the semiconductor film is a solution-processed semiconductor film, and wherein the semiconductor film is formed from a surfactant-assisted aqueous dispersion of nanoflakes of a semiconductor.

2. The memristor of claim 1, wherein the nanoporous membrane comprises an anodized alumina (AAO) membrane with nanopores.

3. The memristor of claim 1, wherein the semiconductor comprises $MoS_2$, $MoSe_2$, $WS_2$, $ReS_2$, InSe, nanocomposites of van der Waals layered semiconductors, or a two-dimensional semiconductor material.

4. The memristor of claim 1, wherein the at least two electrodes are formed of a same metallic material or different metallic materials.

5. A circuitry, comprising one or more memristors according to claim 1.

6. An electronic device, comprising one or more memristors according to claim 1.

7. A memristor, comprising:
a semiconductor film formed on a nanoporous membrane; and
at least two electrodes spatial-apart formed on the semiconductor film and electrically coupled with the semiconductor film to define a channel in the semiconductor film between the at least two electrodes, wherein the channel has one or more filaments, one or more dendrite, or a combination of them formed in the semiconductor film,
wherein the memristor is configured to operably switch from a first resistance state (HRS1) to a resistance state (LRS) at a voltage $V_{ON}$ when bias sweeping from zero to an absolute maximum voltage ($V_{MAX}$), and from the LRS back to a second resistance state (HRS2) at a voltage $V_{OFF}$ when bias sweeping from the absolute maximum voltage ($V_{MAX}$) to zero, wherein a resistance ratio HRS1/HRS2 at zero bias is in a range of about 1.5-10 and a highest value of a HRS1/LRS switching ratio at the voltage $V_{OFF}$ exceeds 100, and wherein a ratio of power dissipation of the memristor at the voltages $V_{ON}$ and $V_{OFF}$ correlates with the resistance ratio HRS1/HRS2 at zero bias.

8. The memristor of claim 7, wherein an internal resistance of the memristor is changeable during switching.

9. A circuitry, comprising one or more memristors according to claim 7.

10. An electronic device, comprising one or more memristors according to claim 7.

11. A memristor, comprising:
a semiconductor film comprising nanoflakes formed on a nanoporous membrane; and
at least two electrodes spatial-apart formed on the semiconductor film and electrically coupled with the semiconductor film to define a channel in the semiconductor film between the at least two electrodes, wherein the channel has one or more filaments, one or more dendrite, or a combination of them formed in the semiconductor film,
wherein the memristor is a thermally activated memristor, and wherein the thermally activated memristor is characterized with switching behavior driven by thermally activated electrical discharge between nanoflakes of the semiconductor film.

12. The memristor of claim 11, wherein the switching behavior of the thermally activated memristor depends on a thickness, d, of the semiconductor film.

13. The memristor of claim 12, wherein d is less than about 800 nm, the thermally activated memristor is a thermistor memristor characterized with a dynamic negative differential resistance (NDR).

14. The memristor of claim 12, wherein d is in a range of about 0.8-3 µm, the thermally activated memristor is a thermistor memristor characterized with thermal runaway.

15. The memristor of claim 14, wherein the channel includes the one or more filaments buried in the semiconductor film and bridging the two electrodes.

16. The memristor of claim 15, wherein the channel further includes the one or more dendrites near electrodes edges without bridging the two electrodes.

17. The memristor of claim 14, wherein the thermistor memristor characterized with the thermal runaway is operably convertible into a write-once-read-many (WORM) memory by either annealing the memristor at a temperature higher than an annealing temperature or by setting an instrument compliance ($I_{COMP}$) of the memristor larger than 10 mA.

18. The memristor of claim 12, wherein d is greater than about 3 the thermally activated memristor is a write-once-read-many (WORM) memory characterized with an irreversible change in conduction by about $10^4$-fold.

19. The memristor of claim 18, wherein the channel includes the one or more dendrites protruding from the channel surface by hundreds of nanometers and bridging the two electrodes.

20. A circuitry, comprising one or more memristors according to claim 11.

21. An electronic device, comprising one or more memristors according to claim 11.

22. A method for fabricating a memristor, comprising:
fabricating a composite film comprising a semiconductor film;
annealing the composite film at an annealing temperature for a period of time; and
depositing at least two electrodes spatial-apart on the annealed composite film to form the memristor, such that the at least two electrodes are electrically coupled with the semiconductor film to define a channel in the semiconductor film between the at least two electrodes, wherein the channel has one or more filaments, one or more dendrite, or a combination of them formed in the semiconductor film, wherein the fabricating step comprises:

mixing powders of a semiconductor and an aqueous solution containing a surfactant to form a mixture thereof;

ultrasonicating the mixture to form a dispersion;

centrifuging the dispersion to remove unexfoliated semiconductor powders;

decanting supernatant of the dispersion for film formation; and collecting the dispersion by vacuum filtration on a prorous membrane, and rinsing the collected dispersion to remove the surfactant; and subjecting the collected dispersion on the prorous membrane to thermal annealing to remove residual water as so to form the composite film having the semiconductor film on the prorous membrane, wherein the semiconductor film comprises nanoflakes of the semiconductor.

23. The method of claim 22, wherein the annealing step is performed in ambient.

24. The method of claim 23, wherein the annealing temperature is in a range of about 220-380° C., and the period of time is in a range of about 10-50 minutes.

25. The method of claim 22, wherein the aqueous solution includes non-ionic Pluronic surfactants or ionic sodium cholate surfactants in addition to surfactant-free ethanol-water co-solvent systems.

26. The method of claim 22, wherein the prorous membrance comprises an anodized alumina (AAO) membrane with nanopores.

27. The method of claim 22, wherein the rinsing step is performed with deionized water.

28. The method of claim 22, wherein the semiconductor comprises $MoS_2$, $MoSe_2$, $WS_2$, $ReS_2$, InSe, nanocomposites of van der Waals layered semiconductors, or a two-dimensional semiconductor material.

29. The method of claim 22, wherein the depositing step is performed by thermal evaporation, electron beam evaporation, or sputtering.

30. A method for fabricating a memristor, comprising:

fabricating a composite film comprising a semiconductor film;

annealing the composite film at an annealing temperature for a period of time; and depositing at least two electrodes spatial-apart on the annealed composite film to form the memristor, such that the at least two electrodes are electrically coupled with the semiconductor film to define a channel in the semiconductor film between the at least two electrodes, wherein the channel has one or more filaments, one or more dendrite, or a combination of them formed in the semiconductor film, wherein the memristor is a thermally activated memristor, wherein depending upon a thickness of the semiconductor film, the memristor operably acts as a thermistor memristor characterized with a dynamic negative differential resistance (NDR) or characterized with thermal runaway, or a write-once-read-many (WORM) memory.

31. The method of claim 30, wherein the thermistor memristor characterized with the thermal runaway is operably convertible into the WORM memory by either annealing the memristor at a temperature higher than the annealing temperature or by setting an instrument compliance ($I_{COMP}$) of the memristor larger than 10 mA.

* * * * *